(12) United States Patent
Amidi

(10) Patent No.: US 6,707,756 B2
(45) Date of Patent: Mar. 16, 2004

(54) SYSTEM AND METHOD FOR TRANSLATION OF SDRAM AND DDR SIGNALS

(75) Inventor: Hossein Amidi, Irvine, CA (US)

(73) Assignee: Smart Modular Technologies, Inc., Fremont, CA (US)

(*) Notice: Subject to any disclaimer, the term of this patent is extended or adjusted under 35 U.S.C. 154(b) by 0 days.

(21) Appl. No.: 10/097,687

(22) Filed: Mar. 12, 2002

(65) Prior Publication Data

US 2003/0174569 A1 Sep. 18, 2003

(51) Int. Cl.$^7$ ................................................. G11C 8/00
(52) U.S. Cl. ........................ 365/233; 365/219; 365/233; 365/238.5
(58) Field of Search ............................ 365/219, 230.03, 365/233, 63, 238.5; 711/105, 167

(56) References Cited

U.S. PATENT DOCUMENTS

| | | | | |
|---|---|---|---|---|
| 6,392,946 B1 | * | 5/2002 | Wu et al. | 365/219 |
| 6,501,671 B2 | * | 12/2002 | Konishi | 365/63 |
| 6,507,888 B2 | * | 1/2003 | Wu et al. | 711/105 |

* cited by examiner

Primary Examiner—Son T. Dinh
(74) Attorney, Agent, or Firm—Thelen Reid & Priest

(57) ABSTRACT

A circuit for converting signals between a memory interface and a memory array is disclosed. The memory interface is not the same type as the memory array such that the signals between the interface and the array need to be synchronized and translated. The circuit includes an interface converter for shifting the logic levels of the signals between the memory interface and the memory array. Furthermore, the circuit has a translation block for translating and synchronizing the signals. In this respect signals between the memory array and the memory interface are synchronized and translated such that the memory array can be used with a memory interface of a different type.

24 Claims, 21 Drawing Sheets

DDR SDRAM Read Wave Form

CL=2, Burst=4
10ns

SDRAM Read Wave Form

CL=2, Burst=4
10ns

DDR SDRAM Write Wave Form
CL=2, Burst=4
10ns

SYSTEM AND METHOD FOR TRANSLATION OF SDRAM AND DDR SIGNALS

BACKGROUND OF THE INVENTION

1. Field of Invention

The present invention relates generally to memory systems and more particularly to a system and method for translating signals between SDRAM and DDR memory systems.

2. Status of the Prior Art

Synchronous Dynamic Random Access Memory (SDRAM) is a type of computer memory that runs synchronously to the system clock. SDRAM is tied to the system clock and is designed to be able to read or write from memory in a burst mode after a prescribed latency period (i.e., typically after an initial read or write latency). SDRAM can write from memory at 1 clock cycle per access (zero wait states) at memory burst speed up to 133 MHZ or SDRAM can read from memory at 2 clock/3 clock cycles per access at memory burst speeds up to 133 MHZ or higher. For instance, memory is written or read from the SDRAM on the positive edge of the clock signal. Accordingly, data is only transferred once per clock cycle.

SDRAM memory has become a memory standard for modern personal computers (PC's) because its synchronized design permits support for high bus speeds. For proper operation, the entire memory must be fast enough for the bus speed of the system. Due to the increased speed of the SDRAM, it has become one of the leading standards for computer memories.

Recently, a new type of memory system has been created which has data read/write times faster than standard SDRAM memory. The new type of memory is call Double Data Rate (DDR) SDRAM. The significant difference between SDRAM and DDR SDRAM is that data is written and read on both edges of the clock signal. For instance, data can be accessed on both the positive and negative edges thereby increasing the bandwidth of the memory by two.

EXAMPLE

System Clock 100 MHZ
SDRAM

> 100 MHZ×72 Bit (8 Byte+1 Byte ECC)=800 MB/Second Transfer Rate

DDR SDRAM

> 200 MHZ×72 Bit (8 Byte+1 Byte ECC)=1600 MB/Second Transfer Rate

The bandwidth of the DDR SDRAM system is increased because data can be accessed on both edges (i.e. positive and negative) of the system clock thereby doubling the speed of the system. Furthermore, in a DDR SDRAM system, the data is written/read with a Data Strobe (DQS) signal which is an asynchronous signal.

Both DDR SDRAM and regular SDRAM memory are not interchangeable. Accordingly, a system designed for DDR SDRAM cannot use regular SDRAM memory. Conversely, a system designed for regular SDRAM memory cannot be upgraded to DDR SDRAM by simply inserting the DDR SDRAM memory. This may be inconvenient for owner's and manufacturers of PC's because they might already have a large stockpile of only one type of memory. For instance, a manufacturer of PC's might have a large stock of regular SDRAM memory that needs to be used. However, the PC's are designed for DDR SDRAM memory. The stock of regular SDRAM memory cannot be used in the PC's due to incompatibility such that the regular SDRAM memory will be wasted.

The present invention addresses the above-mentioned deficiencies in the different memory systems by providing a translator that can make systems designed for one type of memory compatible with the other type of memory. More specifically, the present invention provides a method and system for allowing regular SDRAM memory to be used by a system designed for DDR SDRAM memory. Conversely, the present invention allows systems designed for DDR SDRAM memory to use regular SDRAM memory. Accordingly, the present invention provides a translator which allows either type of memory (i.e, DDR SDRAM or regular SDRAM) to be used.

BRIEF SUMMARY OF THE INVENTION

A circuit for converting signals between a memory interface and a memory array is disclosed. The memory interface is not the same type as the memory array such that the signals between the interface and the array need to be synchronized and translated. The circuit includes an interface converter for shifting the logic levels of the signals between the memory interface and the memory array. Furthermore, the circuit has a translation block for translating and synchronizing the signals. In this respect signals between the memory array and the memory interface are synchronized and translated such that the memory array can be used with a memory interface of a different type.

In accordance with the present invention, the memory interface is a SDRAM memory interface and the memory array is an DDR SDRAM memory array. Alternatively, the memory interface may be a DDR SDRAM memory interface and the memory array is a SDRAM memory array. In either instance, the interface converter will be configured to shift the logic levels between the memory interface and the memory array between LVTTL and SSTL-II logic levels. Furthermore, the translation block will include a burst address decoder for decoding burst address lengths between the memory interface and the memory array. The translation block further includes a buffer for synchronizing the signals between the memory interface and the memory array due to any bandwidth mismatch.

In accordance with the present invention, there is provided a method of synchronizing and translating signals between a memory array and a memory interface wherein the memory array is not the same type as the memory interface. The method commences by shifting the logic levels of the signals between the memory array and the memory interface. In this respect, the logic levels of the signals are shifted between LVTTL and SSTL-II logic levels for SDRAM and DDR SDRAM conversion. Next, address and control signals are translated between the memory interface and the memory array. Finally, the signals are synchronized between the memory array and the memory interface. The synchronization process allows for bandwidth mismatch between the memory array and the memory interface. Typically, the signals are translated using a burst address decoder and synchronized through the use of a buffer.

BRIEF DESCRIPTION OF THE DRAWINGS

These, as well as other features of the present invention will become more apparent upon reference to the drawings wherein.

DETAILED DESCRIPTION OF THE INVENTION

DDR SDRAM to SDRAM Translator

Figure 1:
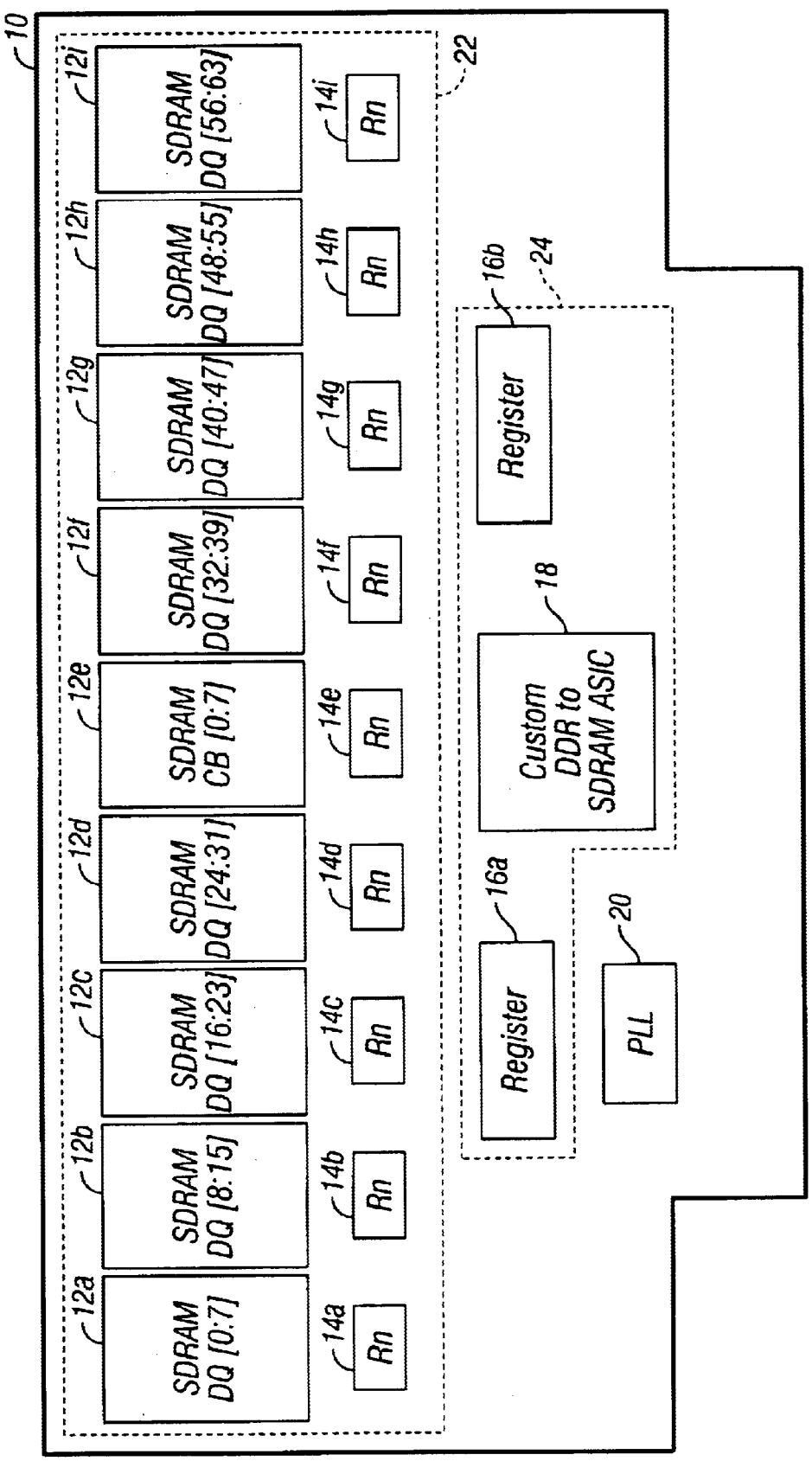
FIG. 1 is a block diagram illustrating a plug-in module for a DDR SDRAM to SDRAM translator.

Referring now to the drawings wherein the showings are for purposes of illustrating preferred embodiments of the present invention only, and not for purposes of limiting the same, FIG. 1 is a block diagram of a 72 bit registered DDR module 10 for use in a computing device compliant with the DDR memory standard. As used throughout the present application, DDR also refers to the DDR SDRAM memory standard. The module 10 is a memory module such as a DIMM or SIMM for a computing device such as a personal computer. The module 10 is insertable into a DDR memory slot of the computing device and allows SDRAM memory on the module 10 to be used in a computing device designed for DDR memory.

In this respect, the module 10 contains nine SDRAM memory chips 12a–12i which are compliant with the SDRAM memory standard. Associated with each respective memory chip 12a–12i is a resistor pack 14a–14i which contains a network of eight resistors for each memory chip 12a–12i, as is standard in a SDRAM memory system. The SDRAM memory chips 12a–12i and the resistors chips 14a–14i form a standard SDRAM memory array 22. The module 10 also includes a phase lock loop (PLL) 20 which is capable of generating an internal timing reference which is used by systems of the module 10. In addition to the foregoing, the module 10 includes two general purpose registers 16a and 16b which are used by a DDR to SDRAM ASIC 18 in converting the signals between the computing device and the module 10 for proper functionality. The DDR to SDRAM ASIC 18 and registers 16 form a DDR to SDRAM translator interface 24. As will be further explained below, the DDR to SDRAM translator interface 24 is operable to convert the control, data, and addressing signals between the computing device and the SDRAM memory chips 12a–12i. In this regard, it is possible to use SDRAM memory chips 12a–12i in a computing device which was designed for DDR SDRAM memory chips.

Even though the DDR to SDRAM translator interface 24 is being shown to operate on a memory module 10, it will be recognized by those of ordinary skill in the art that the translator interface 24 can also be used on a motherboard of a computing device or in an embedded system. The module 10 is only shown of one illustrative use for the translator interface 24.

Figure 2:
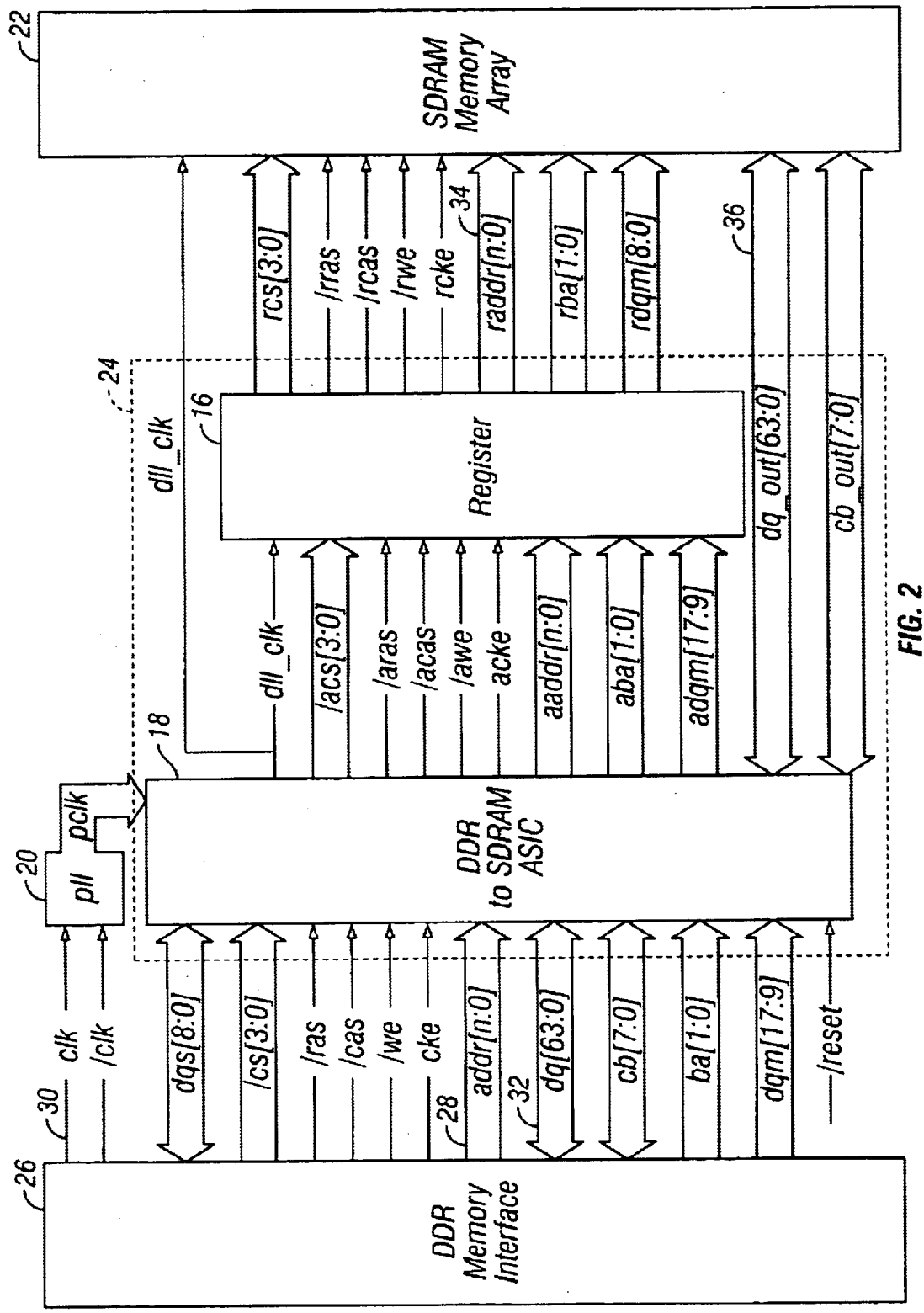
FIG. 2 is a block diagram of a DDR SDRAM to SDRAM translator.

FIG. 2 is a block diagram showing the DDR to SDRAM translator interface 24 which can be used to translate signals from a SDRAM memory array 22 to a DDR (SDRAM) memory interface 26. The DDR memory interface 26 receive signals from the computing system. Typically, the DDR memory interface 26 is operative to connect to a DDR memory module and provide the correct connectivity and signals between the DDR memory module and the computing system. The main processor for the computing system generates signals at the system-side for the DDR memory.

As previously discussed, it would be desirable to utilize non-DDR memory with the computing system. However, the processor of the computing system and the DDR memory interface 26 are configured to generate signals compatible only to a DDR memory array. Therefore, the signals between the DDR memory interface 26 and the SDRAM memory array 22 need to be translated and synchronized for the SDRAM memory array 22 to function correctly. The read and write wave forms for DDR and SDRAM memories are shown in FIGS. 15–18.

As previously mentioned, the translator interface 24 includes a DDR to SDRAM ASIC (application specific integrated circuit) 18 and a register 16. The DDR to SDRAM ASIC 18 is a signals translator between the DDR memory interface 26 and the SDRAM memory array 22. In this respect, the DDR to SDRAM ASIC 18 receives control signals, address signals and data signals from the DDR memory interface 26. For example, address lines addr 28, and data bus lines dq 32 are connected to the DDR to SDRAM ASIC 18 which translates them for use by the SDRAM memory array 22. Address lines addr 28 are translated to address lines raddr 34 for the SDRAM memory array 22, while data lines dq 32 are translated to dq_out 36. The SDRAM register 16 is a standard register that supports custom modes of the SDRAM memory array 22. In this respect, the SDRAM register 16 may be operative to support any low-power mode of the SDRAM memory array 22 or buffer and clock the load of SDRAM memory array 22.

Figure 3:
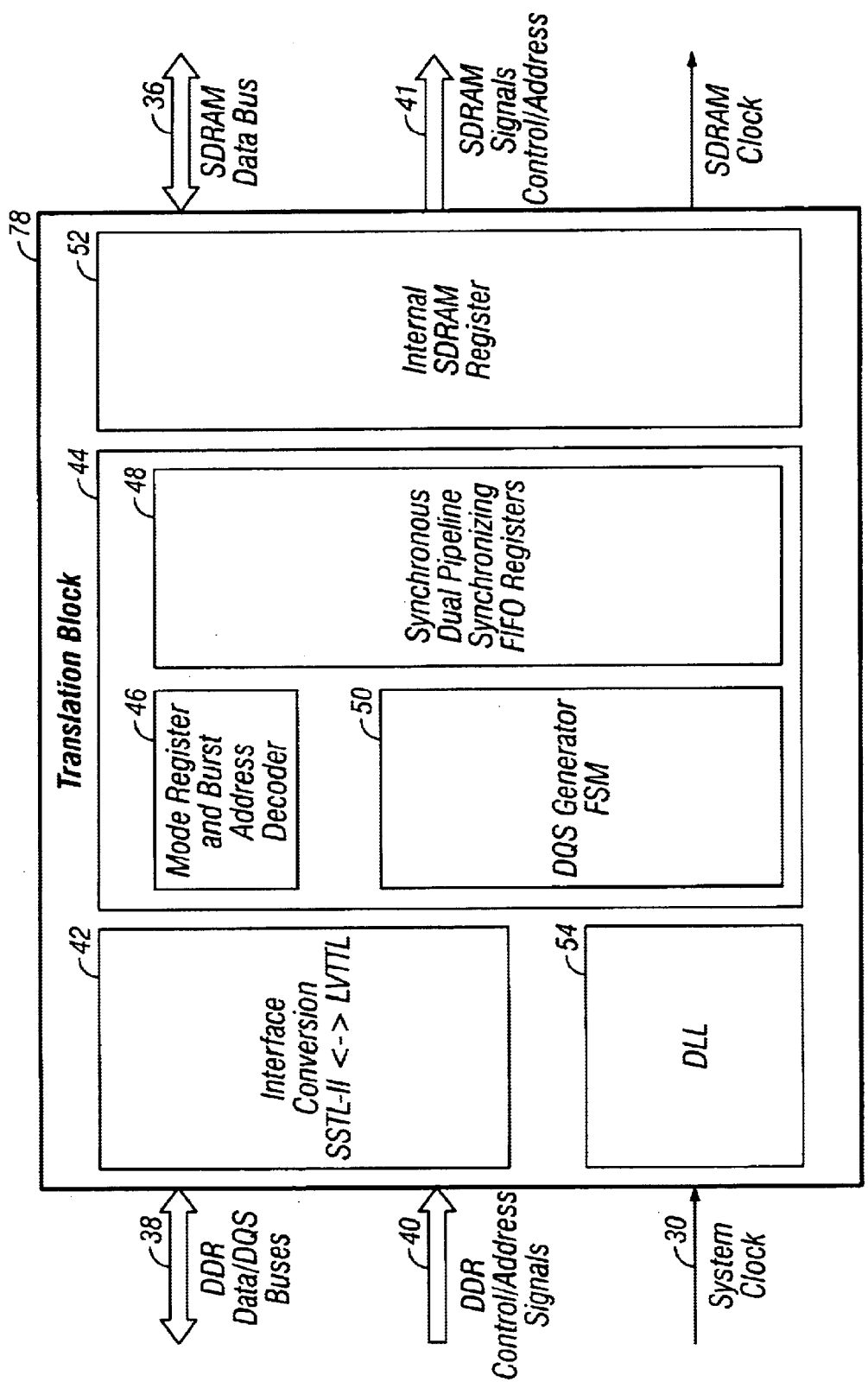
FIG. 3 is a block diagram of the DDR to SDRAM ASIC shown in FIG. 2.

Referring to FIG. 3, a block diagram of the DDR to SDRAM ASIC 18 is shown. System-side DDR memory data bus and DQS signals are connected into the DDR to SDRAM ASIC 18 by DDR DATA/DQS buses 38. Similarly, DDR control/address signals 40 connect the system-side DDR memory control/address signals into the DDR to SDRAM ASIC 18. System clock 30 is also inputted into the DDR to SDRAM ASIC 18.

The DDR to SDRAM ASIC 18 has an SSTL-II to LVTTL interface conversion 42 to provide the appropriate logic levels between the DDR memory interface 26 and SDRAM memory array 22. The DDR memory operates using SSTL-II (stub series-terminate logic) levels wherein $V_{DD}$ is about 2.5V. However, regular SDRAM uses LVTTL (low voltage transistor-transistor logic) levels wherein $V_{DD}$ is about 3.3 V. Therefore the interface conversion 42 is operative to shift the logic levels of the incoming and outgoing signals accordingly. The interface conversion 42 converts the interface logic of DDR SDRAM to regular SDRAM for voltage levels and interface architecture.

The DDR to SDRAM ASIC 18 further includes a translation block 44 which has a mode register and burst address decoder 46. The DDR to SDRAM ASIC 18 also has a synchronous dual pipeline synchronizing FIFO buffer 48 and a DQS Generator Finite State Machine 50. The translation block 44 provides the correct timing of signals between the DDR memory interface 26 and the SDRAM memory array 22. The DDR to SDRAM ASIC 18 further includes an internal SDRAM register 52 and delay lock loop (DLL) 54 for an internal system clock of the ASIC 18.

Figure 7:
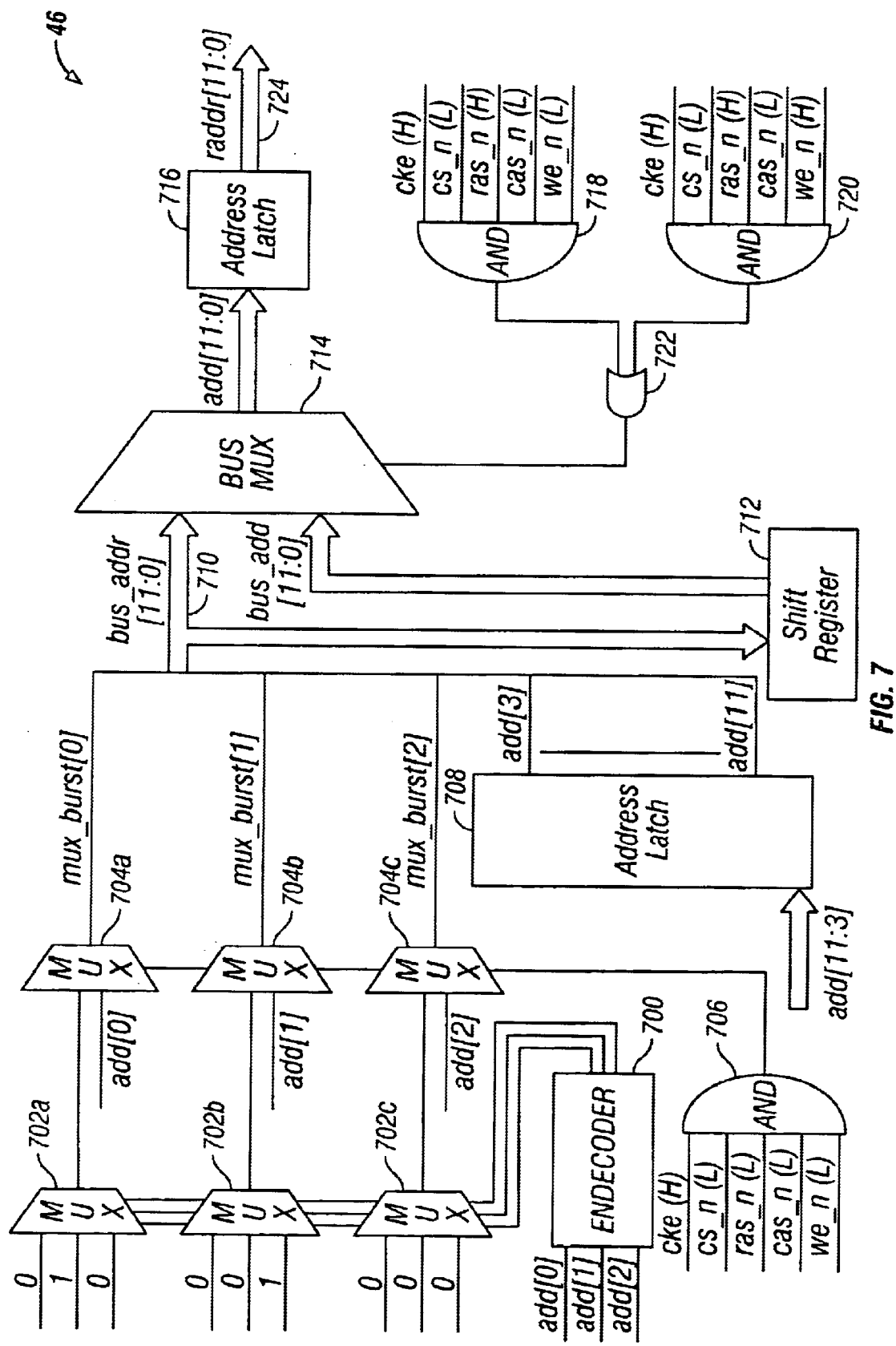
FIG. 7 is a circuit diagram of a mode address decoder for the translator shown in FIG. 2.

The mode register and burst address decoder 46 converts burst lengths from the DDR memory interface 26 into burst lengths that are recognized by the SDRAM memory array 22. Referring to FIG. 7, a circuit for the mode register and address decoder 46 is shown. The decoder 46 must convert the burst modes from the DDR memory interface 26 into standard SDRAM burst modes. The decoder 46 has an encoder 700 and a first set of multiplexers 702a–702c. The inputs to the multiplexers 702a, 702b, and 702c are the different burst modes "010", "001", and "000" for the SDRAM memory array 22. The input to the encoder 700 are address lines add[0], add[1] and add[2] which indicate the DDR burst mode. The appropriate multiplexer is enabled depending upon the burst mode indicated by the address lines add[0], add[1] and add[2]. The output of the multiplexers 702a–702c are the input to a second set of multiplexers 704a–704c which also have address lines add[0], add[1], and add[2] as inputs. The multiplexers 704a–704c are enabled by logically ANDING cke, cs__n, ras__n, cas__n and we__n with AND gate 706. The respective output of each of the multiplexers 704a–704c generates mux_burst[0], mux_burst[1] and mux_burst [2]. The mode register and address decoder 46 further includes address latch 708 which latches address lines add[3] to add[11].

The address lines add[3] to add[11] from the address latch 708 are placed on address bus 710, along with the outputs from the multiplexers 704a–704c (i.e., mux_burst[0], mux_burst[1], and mux_burst[2]. The bus_addr[11:0] lines are inputted into shift register 712 for use in burst mode, or inputted into multiplexer bus mux 714. In order to enable the proper timing of bus mux 714, control signals are fed into AND gates 718 and 720 with the result being logically OR'ed by OR gate 722. The output of the bus mux multiplexer 714 are address lines addr[11:0] which are fed into address latch 716 and can be accessed as raddr[11:0] 24 by the SDRAM memory array 22.

The FIFO buffer 48 of the ASIC 18 performs bandwidth mismatch conversion to synchronize the DDR memory interface 26 and the SDRAM memory array 22. As previously mentioned, the DDR memory interface 26 operates at twice the bandwidth of the SDRAM memory array 22. The dual pipeline FIFO buffer 48 can accommodate for the frequency mismatch by storing data from the DDR memory interface 26 that cannot be immediately written or read by the SDRAM memory array 22. Therefore the FIFO buffer 48 can synchronize the read/write cycles.

Figure 6:
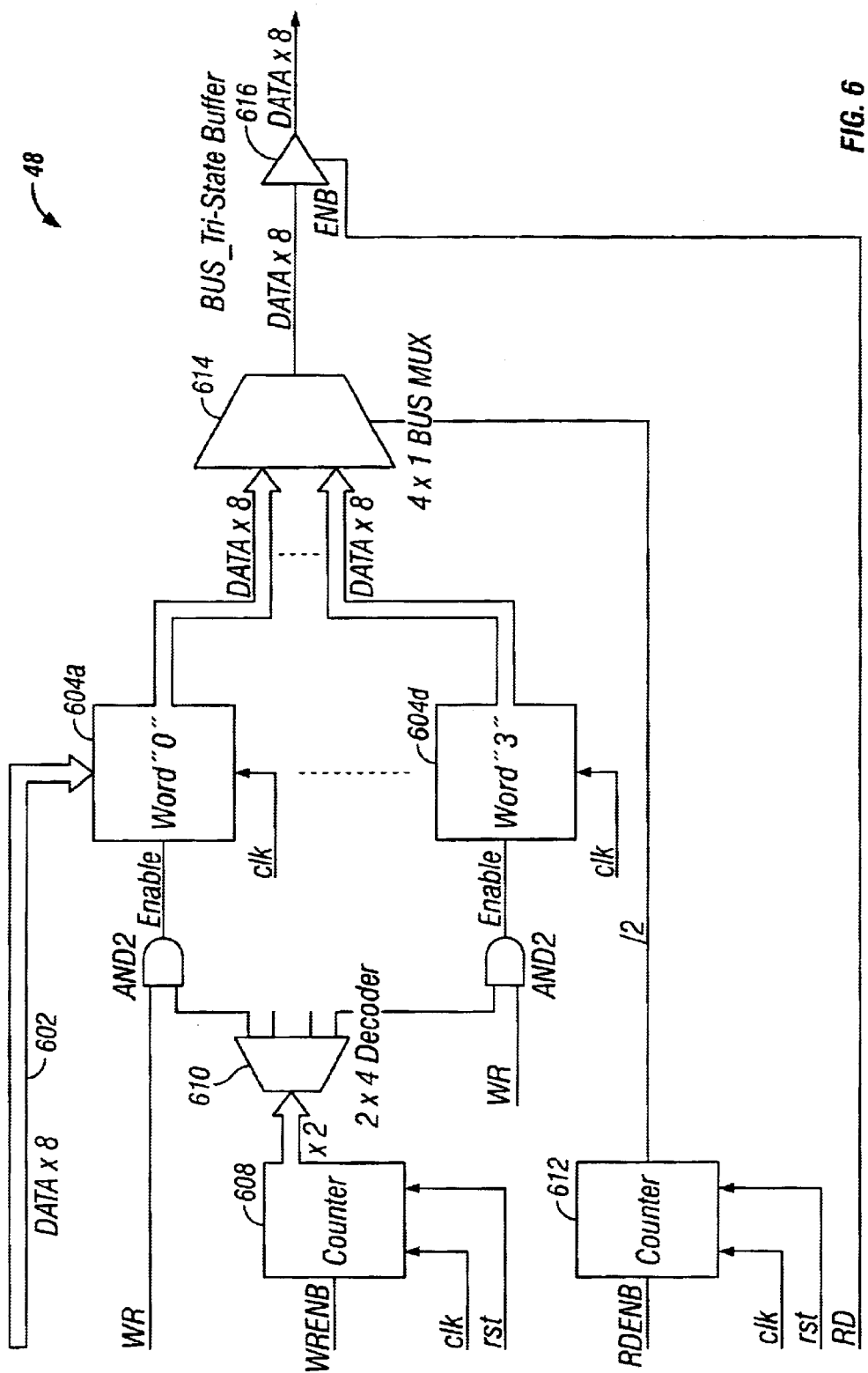
FIG. 6 is a circuit diagram of a synchronous dual pipeline synchronizing FIFO for the translator shown in FIG. 2.

Referring to FIG. 6, a circuit diagram for the FIFO buffer 48 is shown. Data lines 602 are inputted into buffers 604a–604d. For simplicity, buffers 604b and 604c are not shown. Buffer 604a stores word "0", buffer 604b stores word "1", buffer 604c stores word "2", and buffer 604d stores word "3". Each buffer 604 is appropriately enabled from counter 608 and 2×4 decoder 610. The counter 608 will provide a count which is decoded by the decoder 610 to enable the appropriate buffer 604. When the appropriate buffer 604 is enabled, it's output is sent to 4×1 multiplexer 614 which is enabled at the appropriate timing reference signal by a second counter 612. The 4×1 multiplexer 614 can synchronize the data output for use by the SDRAM memory array 22.

Figure 4:
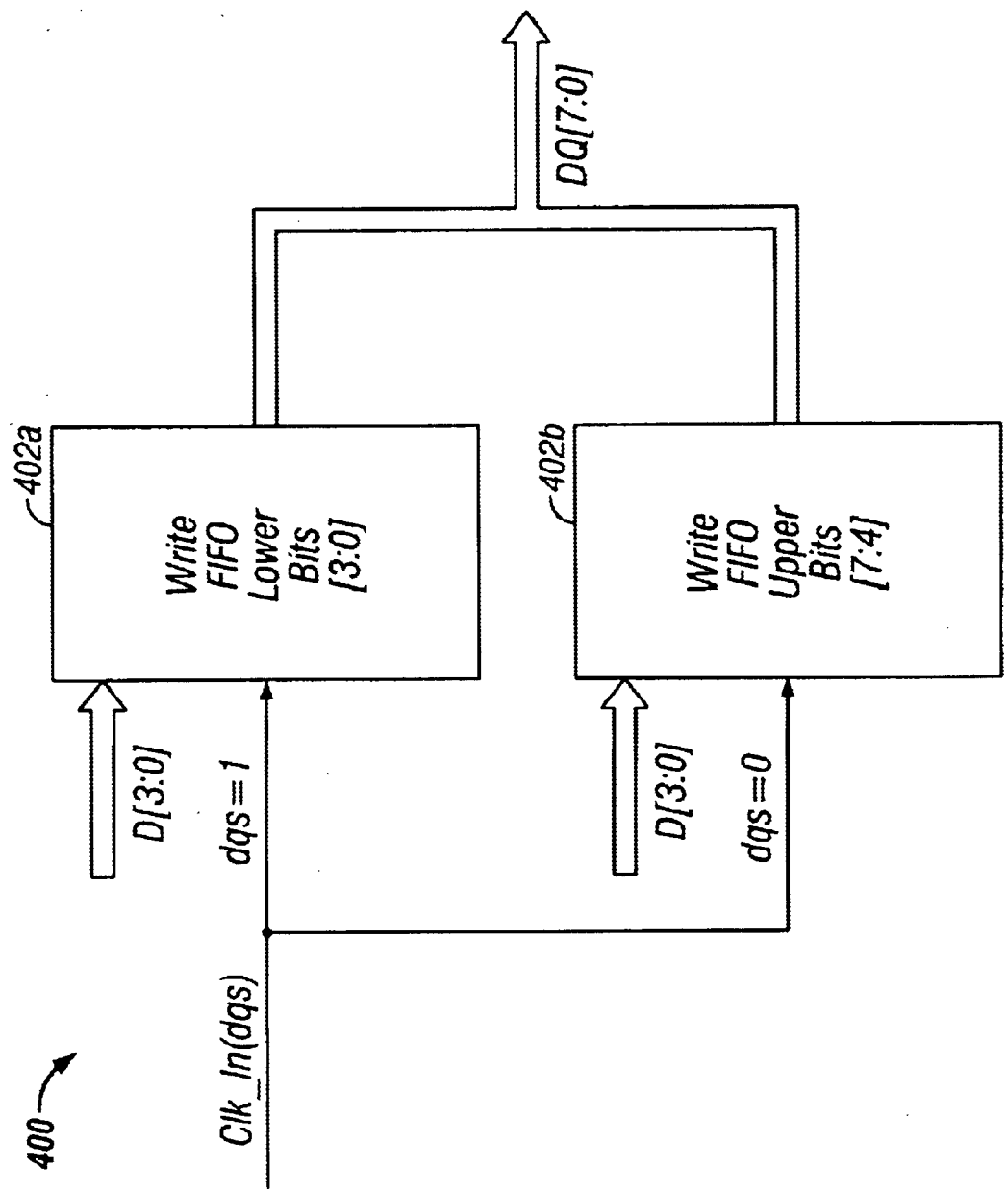
FIG. 4 is a circuit diagram of a DDR SDRAM to SDRAM bit convertor for the translator shown in FIG. 2.

Referring to FIG. 4, a DDR to SDRAM Bit conversion circuit (nibble to byte) 400 is shown. The data from the DDR memory interface 26 is four bit data whereas the SDRAM memory array 22 uses eight bit data. Therefore it is necessary to convert the data for proper operation. The conversion circuit 400 has a lower bit buffer 402a and an upper bit buffer 402b. Data bus D[3:0] is inputted into each buffer. Each buffer is enabled by a clock-in signal clk_in(dqs) which corresponds to the datastrobe dqs signal. The lower bit buffer 402a is enabled when dqs=1 and will output lower bits DQ[3:0] at that time. Conversely, the upper bit buffer 402b is enabled when dqs=0 and will output upper bits DQ[7:4] at that time. Therefore, it is possible to convert the four bit DDR memory data to eight bits for use by SDRAM memory array 22.

Figure 5:
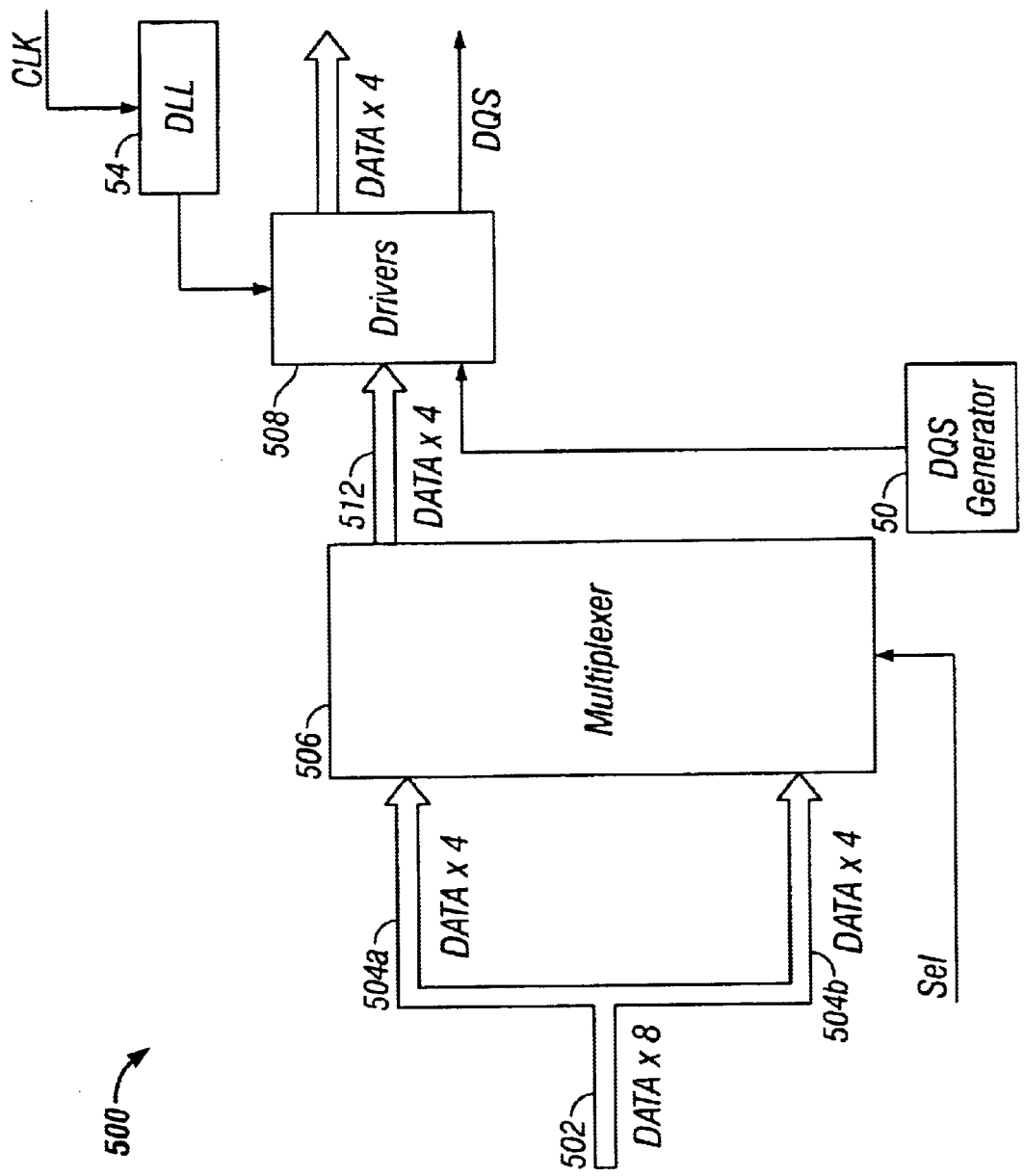
FIG. 5 is a circuit diagram of a SDRAM to DDR bit convertor for the translator shown in FIG. 2.

Conversely, the eight bit SDRAM data must be converted to four bits for the DDR memory interface 26. Referring to FIG. 5, a SDRAM to DDR bit conversion (Byte to Nibble) circuit 500 is shown. Eight bit data 502 from the SDRAM memory array 22 is segregated into two sets for four bit data 504a and 504b which is inputted into multiplexer 506. A select signal "Sel" enables the multiplexer 506 to output the four bit data on data bus 512. The outputted four bit data 512 is inputted into driver module 508 that is controlled by DQS generator FSM 50. Furthermore, a timing signal from DLL 54 is provided to the drivers 508. The drivers 508 are operative to output four bit data, as well as corresponding data strobe signal DQS for use by the DDR memory interface 26.

Figure 19:
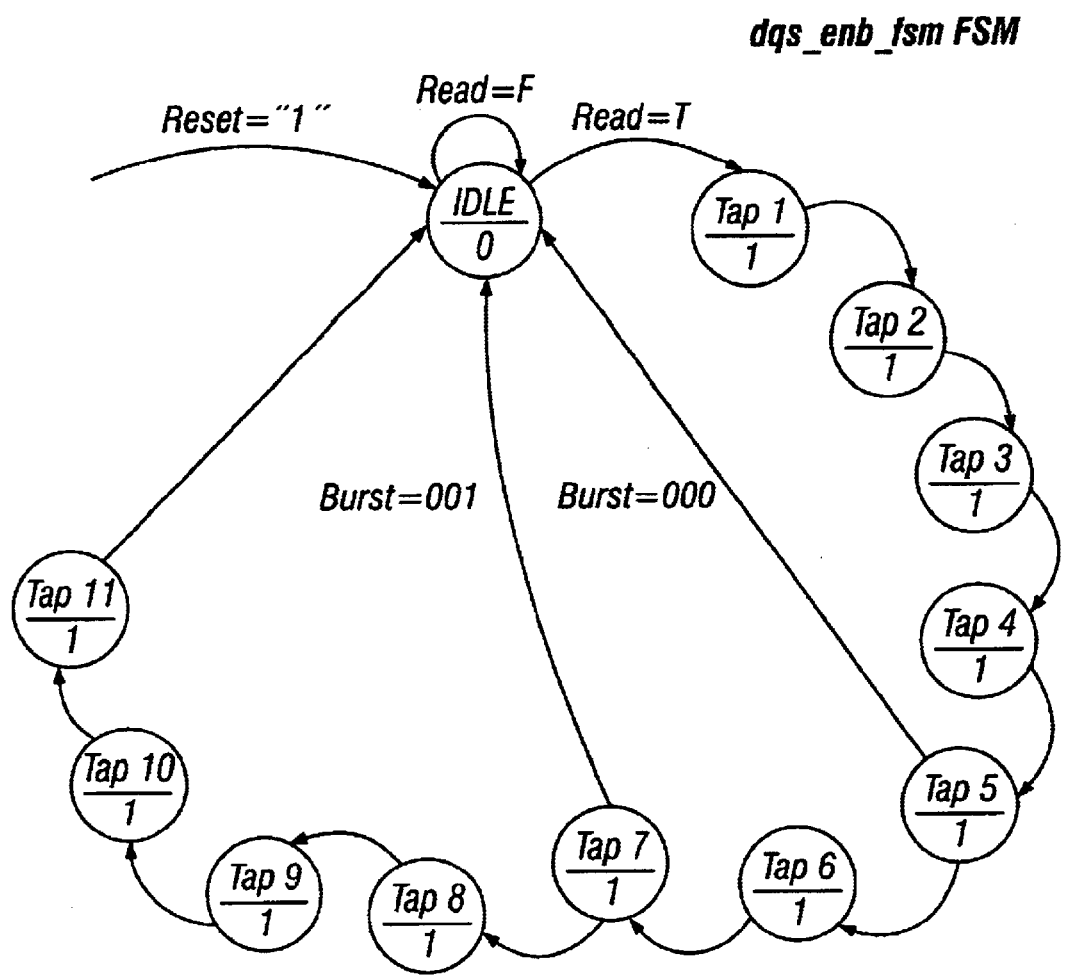
FIGS. 19–21 are state diagrams for the finite state machines of both the DDR SDRAM to SDRAM and SDRAM to DDR SDRAM translators.
Figure 20:
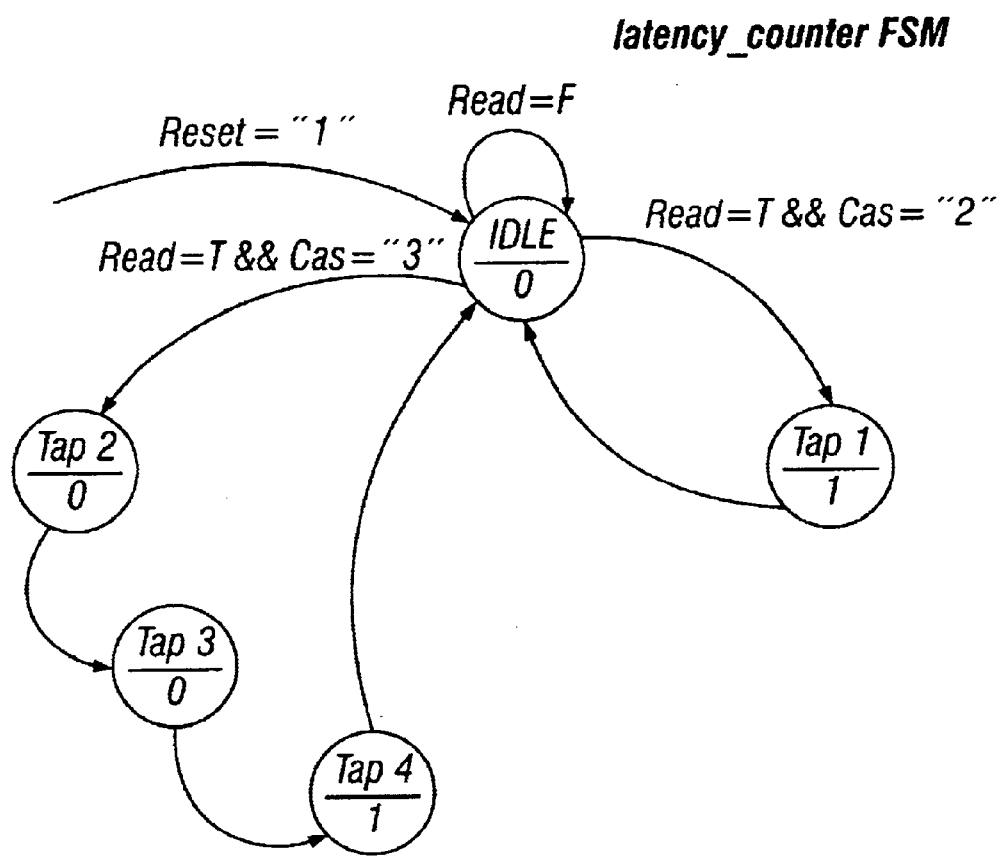
Figure 21:
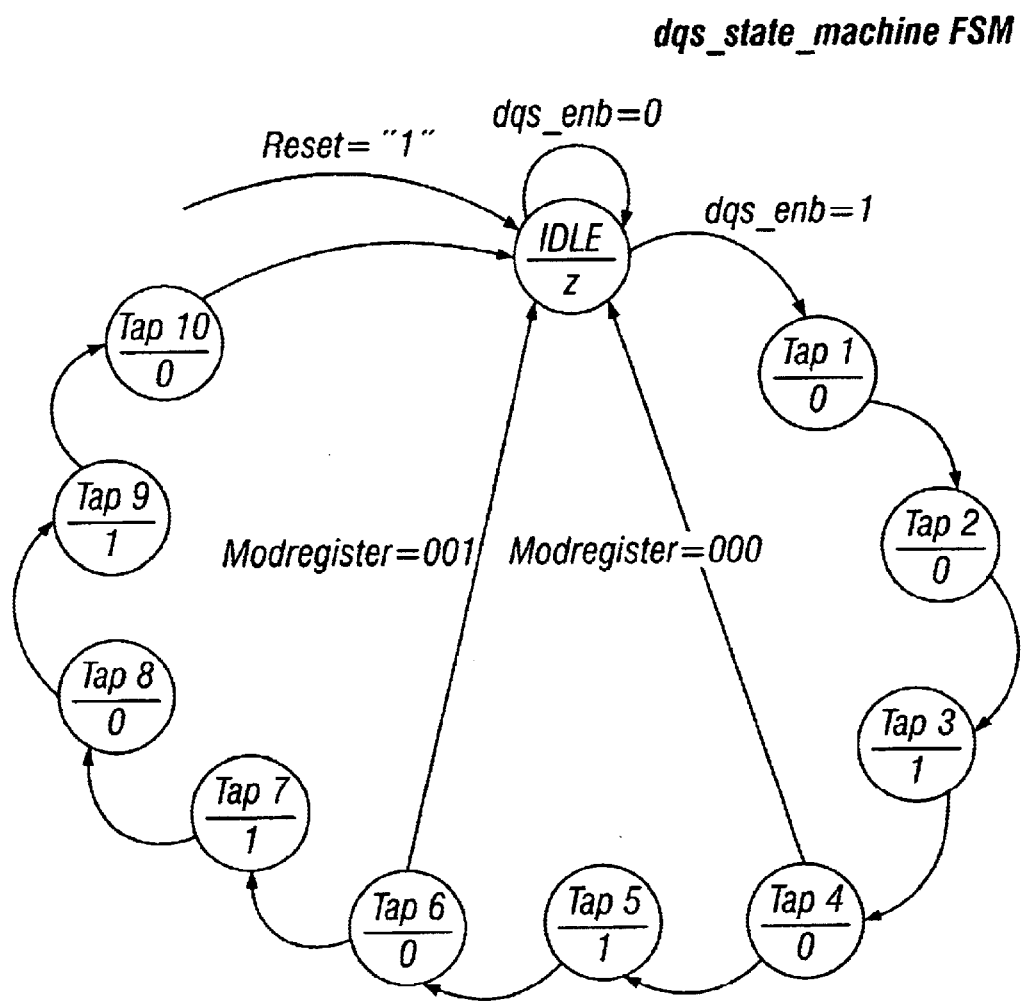

Referring to FIG. 19, a dqs_enb state machine diagram for the DQS generator FSM 50 is shown. The dqs_enb state machine will check the incoming signals (cke, cs__n, ras__n, cas__n and we__n) to detect the read signal command. If the read signal command is detected, the dqs_enb machine will generate the appropriate dqs_enb signal. Because there are three possible burst modes lengths, the dqs_enb machine will need to detect which burst mode is set and act accordingly. Referring to FIG. 20, a latency counter state machine diagram is shown for the DQS generator FSM 50. The latency counter state machine will also detect the read command signal, but will also detect the latency of the device and generate a latency enable for 2 or 3 latency. The dqs_enb state machine (i.e., FIG. 19) will receive the latency enable signal from the latency counter FSM shown in FIG. 20. Referring to FIG. 21, a dqs_state_machine state diagram for the DQS generator FSM 50 is shown. The dqs_state_machine FSM will generate the actual DQS (data strobe) signal based on the dqs_enb and latency_counter FSM's. The dqs signal could vary in shapes based on burst mode of 2, 4, or 8. As previously mentioned above, the DQS signal is derived from the drivers 508 based upon the DQS generator 50, as shown in FIG. 5.

SDRAM to DDR SDRAM Translator

Figure 8:
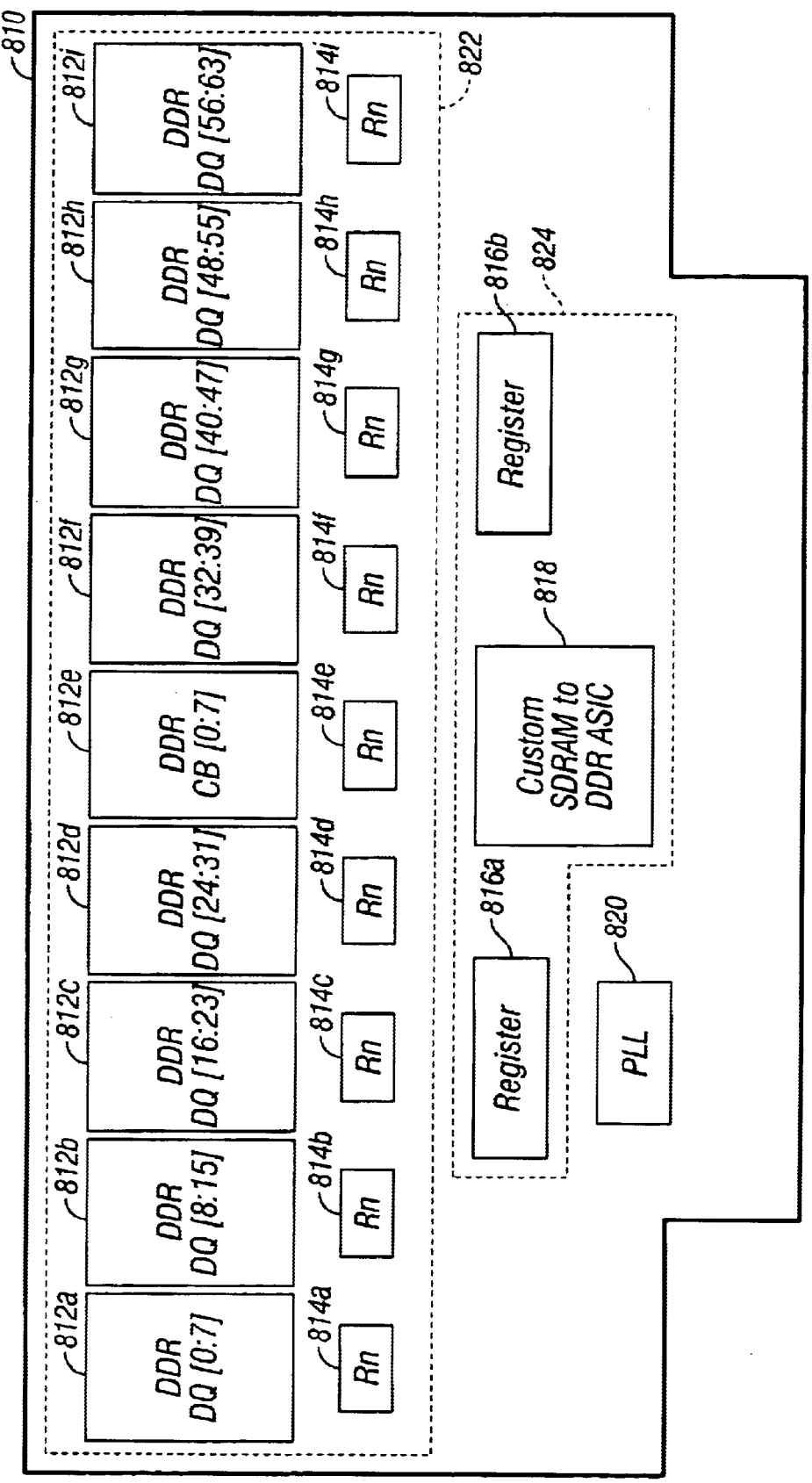
FIG. 8 is a block diagram illustrating a plug-in module for a SDRAM to DDR SDRAM translator.

FIG. 8 is a block diagram of a 72 bit registered SDRAM module 810 for use in a computing device compliant with the SDRAM memory standard. The module 810 is a memory module such as a DIMM or SIMM for a computing device such as a personal computer. The module 810 is insertable into a SDRAM memory slot of the computing device and allows DDR memory to be used in a computing device designed for SDRAM memory.

In this respect, the module 810 contains nine DDR memory chips 812a–812i which are compliant with the DDR memory standard. Associated with each respective memory chip 812a–812i is a resistor pack 814a–814i which contains a network of eight resistors for each memory chip 812a–812i, as is standard in registered DDR memory systems. The DDR memory chips 812a–812i and the resistor chips 814a–814i form a standard DDR memory array 822. The module 810 also includes a phase lock loop (PLL) 820 which is capable of generating an internal timing reference which is used by systems of the module 810. In addition to the foregoing, the module 810 includes two general purpose registers 816a and 816b which are used by a SDRAM to DDR ASIC 818 that converts the signals between the computing device and the module 810 for proper functionality. The SDRAM to DDR ASIC 818 and the registers 816 form a SDRAM to DDR translator interface 824. As will be further explained below, the SDRAM to DDR translator interface 824 is operable to convert the control, data, and addressing signals between the computing device and the DDR memory chips 812a–812i. In this regard, it is possible to use DDR memory chips 812a–812i in a computing device which was designed for SDRAM memory chips.

Even though the SDRAM to DDR translator interface 824 is being shown to operate on a memory module 810, it will be recognized by those of ordinary skill in the art that the translator interface 824 can also be used on a motherboard of a computing device or in an embedded system. The module 810 is only shown as one illustrative use for the translator interface 824.

Figure 9:
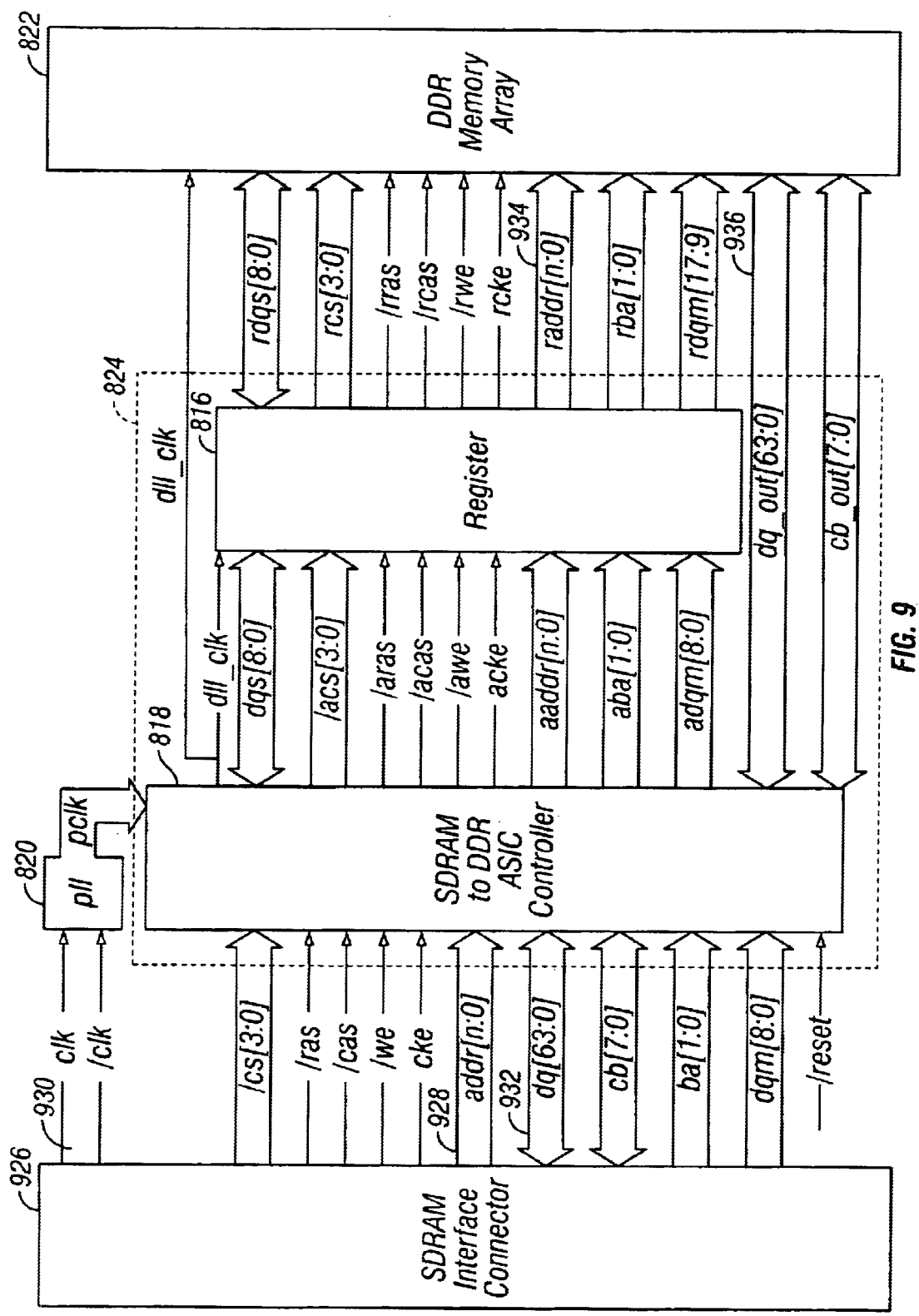
FIG. 9 is a block diagram of a SDRAM to DDR SDRAM translator.

FIG. 9 is a block diagram showing the SDRAM to DDR translator interface 824 which can be used to translate signals from the DDR memory array 822 to a SDRAM memory interface 926. The SDRAM memory interface 926 receive signals from the computing system. Typically, the SDRAM memory interface 926 is operative to connect to a SDRAM memory module and provide the correct connectivity and signals between the SDRAM memory module and the computing system. The main processor for the computing system generates signals at the system-side for the SDRAM memory.

As previously discussed, it would be desirable to utilize DDR memory with the computing system. However, the processor of the computing system and the SDRAM memory interface 926 are configured to generate signals compatible only to a SDRAM memory array. Therefore, the signals between the SDRAM memory interface 926 and the DDR memory array 822 need to be translated and synchronized for the DDR memory array 822 to function correctly.

As previously mentioned, the translator interface 824 includes a SDRAM to DDR ASIC (application specific integrated circuit) 818 and a register 816. The SDRAM to DDR ASIC 818 is a signals translator between the SDRAM memory interface 926 and the DDR memory array 822. In this respect, the SDRAM to DDR ASIC 818 receives control signals, address signals and data signals from the SDRAM memory interface 926. For example, address lines addr 928 and data bus lines dq 932 are connected to the SDRAM to DDR ASIC 818 which translates them for use by the DDR memory array 822. Address lines addr 928 are translated to address lines raddr 934, while data lines dq 932 are translated to dq_out 936. The DDR register 816 is a standard register that supports custom modes of the DDR memory array 822. In this respect, the DDR register 816 may be operative to support any low-power mode of the DDR memory array 822 or buffer and clock the load of DDR memory array 822.

Figure 10:
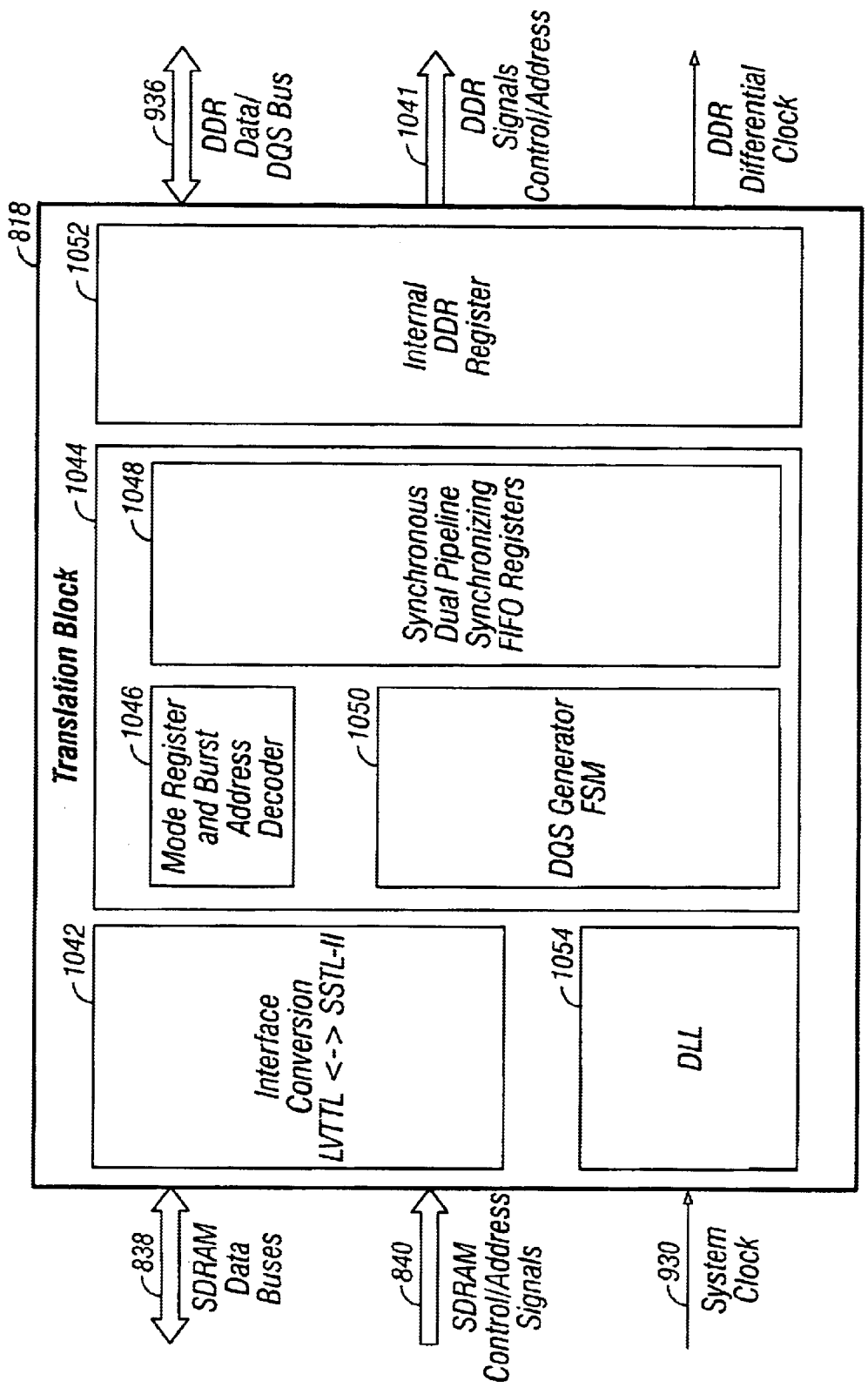
FIG. 10 is a block diagram of the SDRAM to DDR SDRAM ASIC shown in FIG. 9.

Referring to FIG. 10, a block diagram of the SDRAM to DDR ASIC 818 is shown. System-side SDRAM memory data buses are connected into the SDRAM to DDR ASIC 818 by SDRAM DATA buses 838. Similarly, SDRAM control/address signals 840 connect the system-side SDRAM memory control/address signals into the SDRAM to DDR ASIC 818. System clock 930 is also inputted into the SDRAM to DDR ASIC 818.

The SDRAM to DDR ASIC 818 has an LVTTL to SSTL-II interface conversion 1042 to provide the appropriate logic levels between the SDRAM memory interface 926 and DDR memory array 822, as previously discussed. The DDR memory operates using SSTL-II (stub series-terminate logic) levels wherein $V_{DD}$ is about 2.5V. However, regular SDRAM uses LVTTL (low voltage transistor-transistor logic) levels wherein $V_{DD}$ is about 3.3 V. Therefore the interface conversion 1042 is operative to shift the logic levels of the incoming and outgoing signals accordingly. The interface conversion 1042 converts the interface logic of SDRAM to regular DDR SDRAM for voltage levels and interface architecture.

The SDRAM to DDR ASIC 818 further includes a translation block 1044 which has a mode register and burst address decoder 1046. The SDRAM to DDR ASIC 818 also has a synchronous dual pipeline synchronizing FIFO buffer 1048 and a DQS Generator Finite State Machine 1050. The translation block 1044 provides the correct timing of signals between the SDRAM memory interface 926 and the DDR memory array 822. The SDRAM to DDR ASIC 818 further includes an internal DDR register 1052 and delay lock loop (DLL) 1054 for an internal system clock of the ASIC 818.

Figure 14:
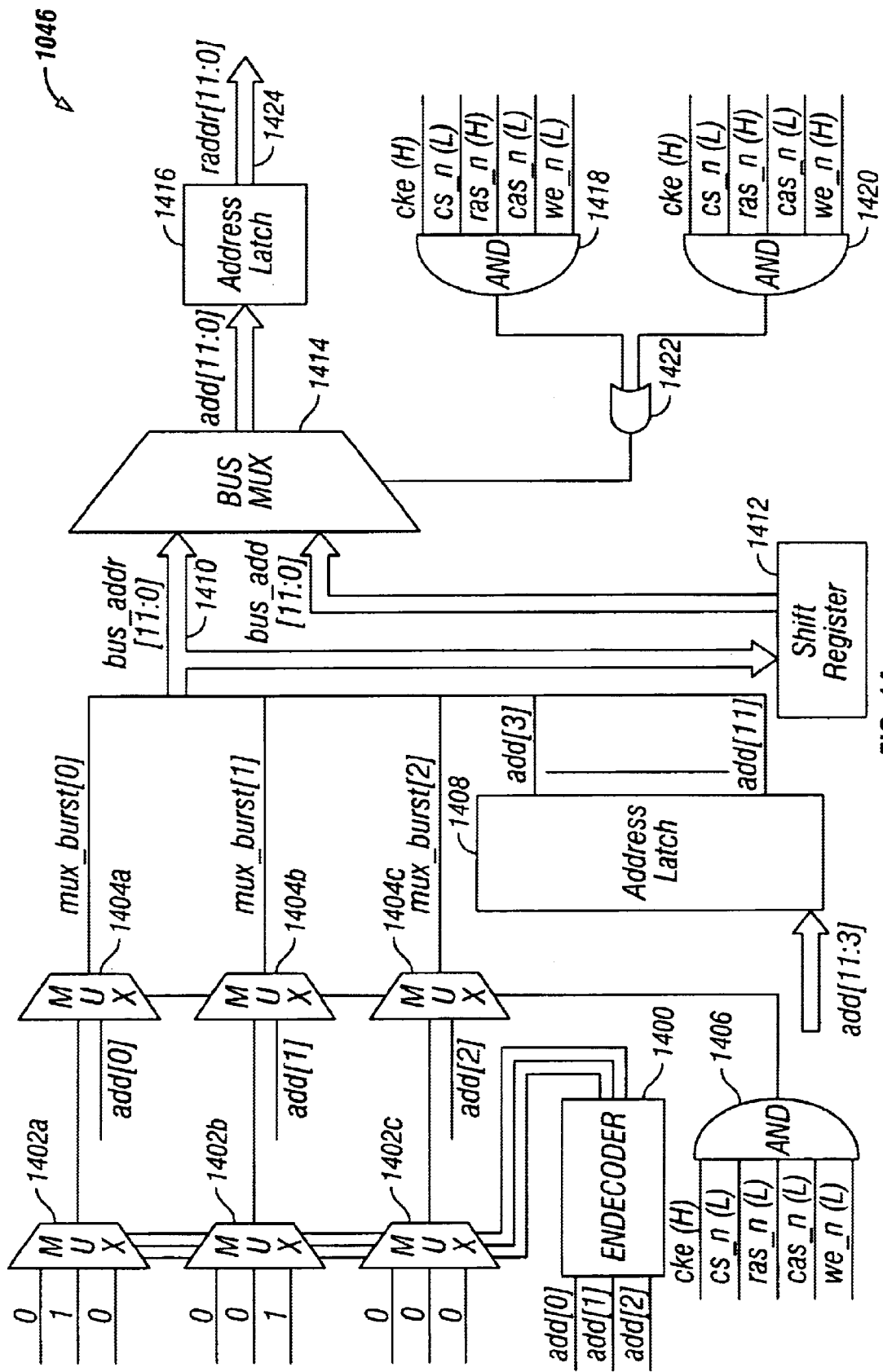
FIG. 14 is a circuit diagram of a mode register and address decoder for the translator shown in FIG. 8.
Figure 15:
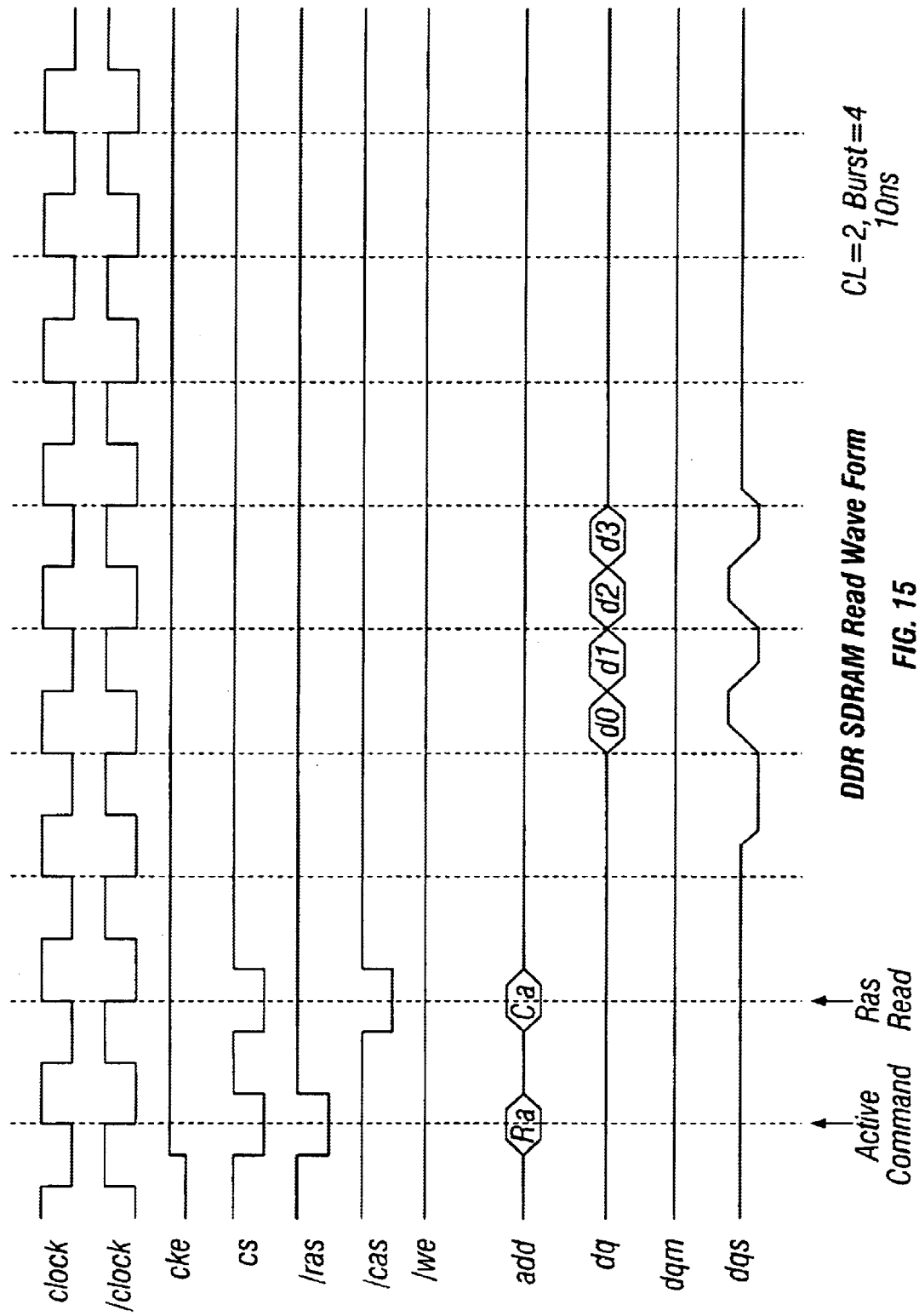
FIG. 15 is a timing diagram for a DDR SDRAM read wave form.
Figure 16:
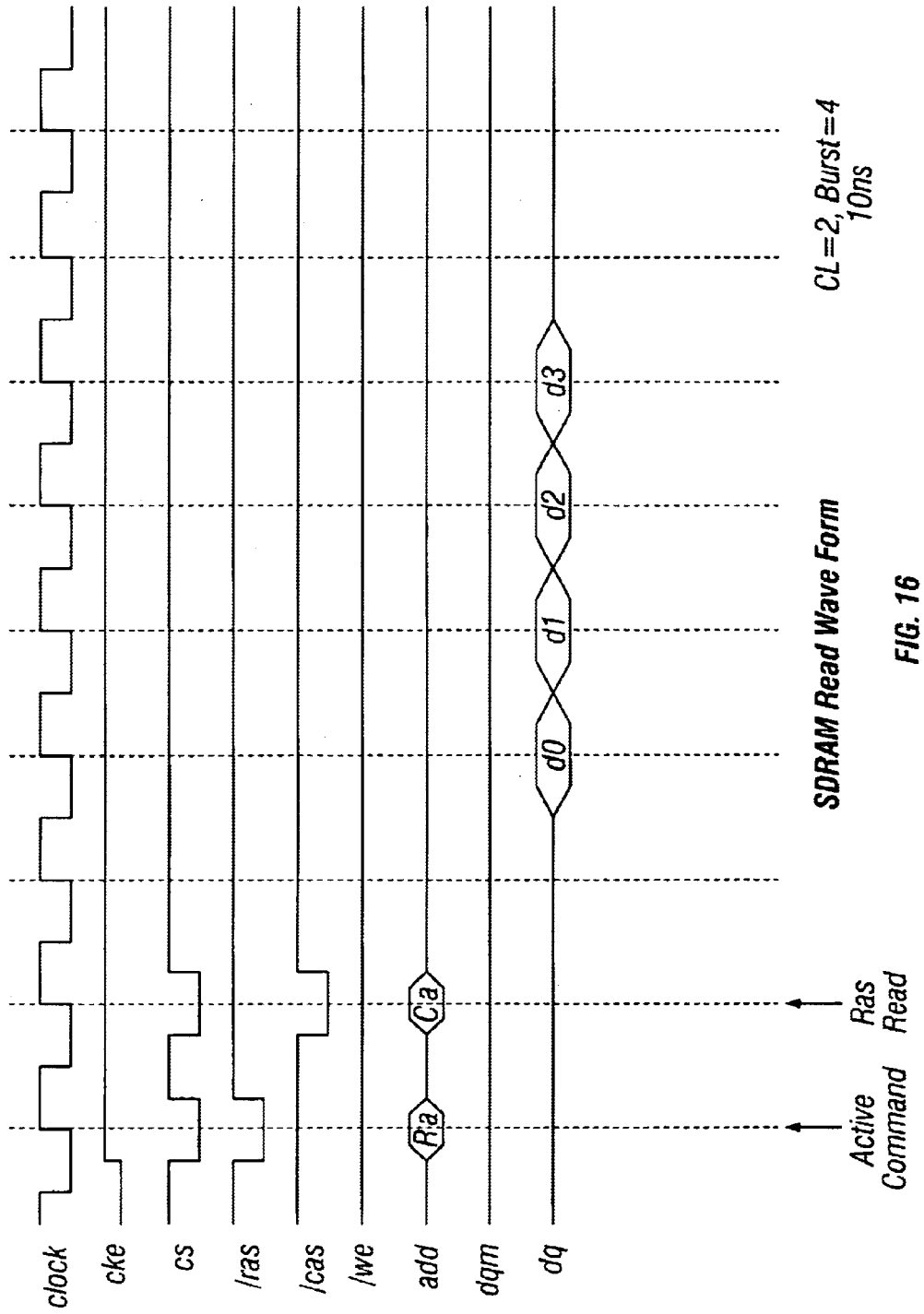
FIG. 16 is a timing diagram for a SDRAM read wave form.
Figure 17:
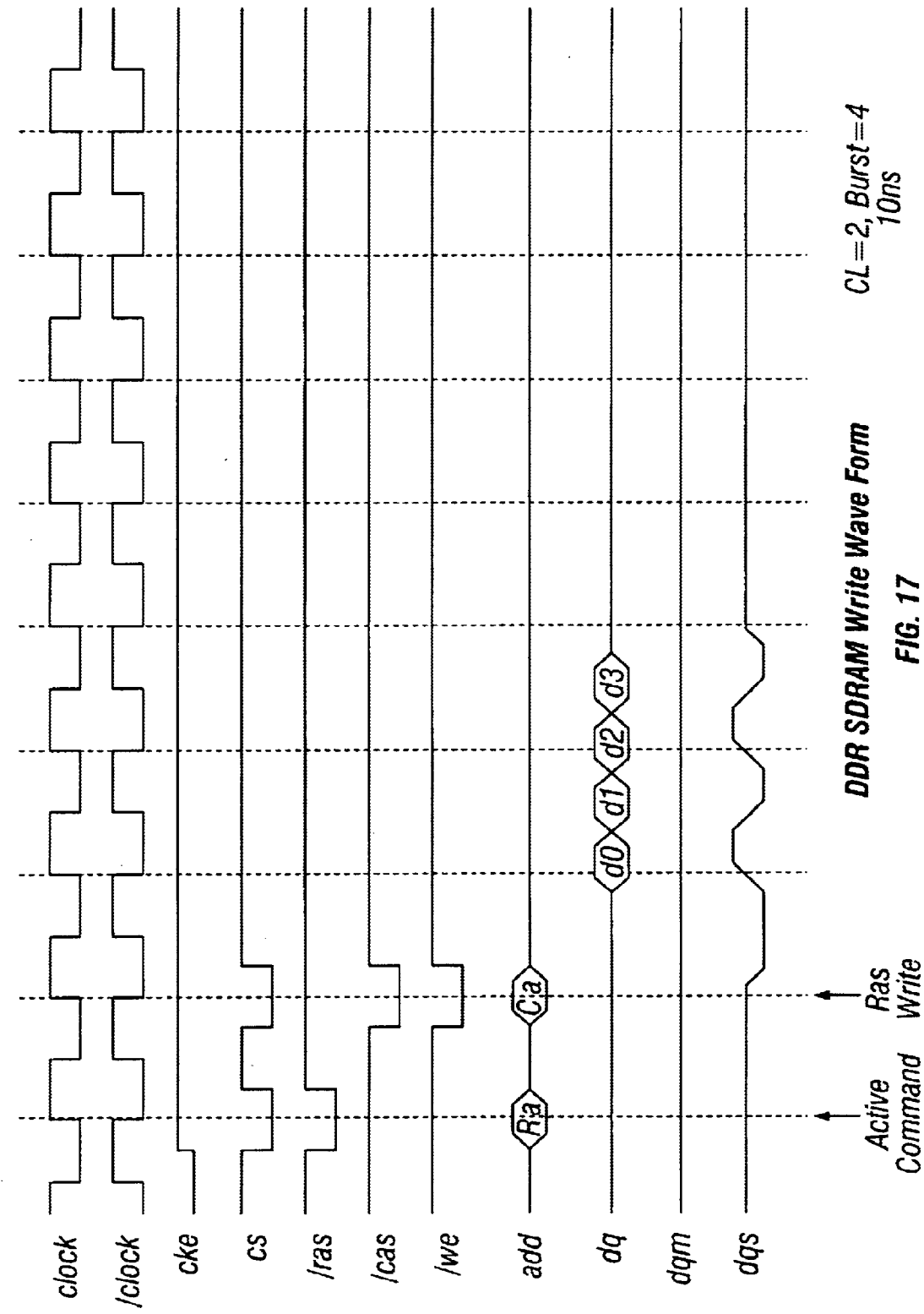
FIG. 17 is a timing diagram for a DDR SDRAM write wave form.
Figure 18:
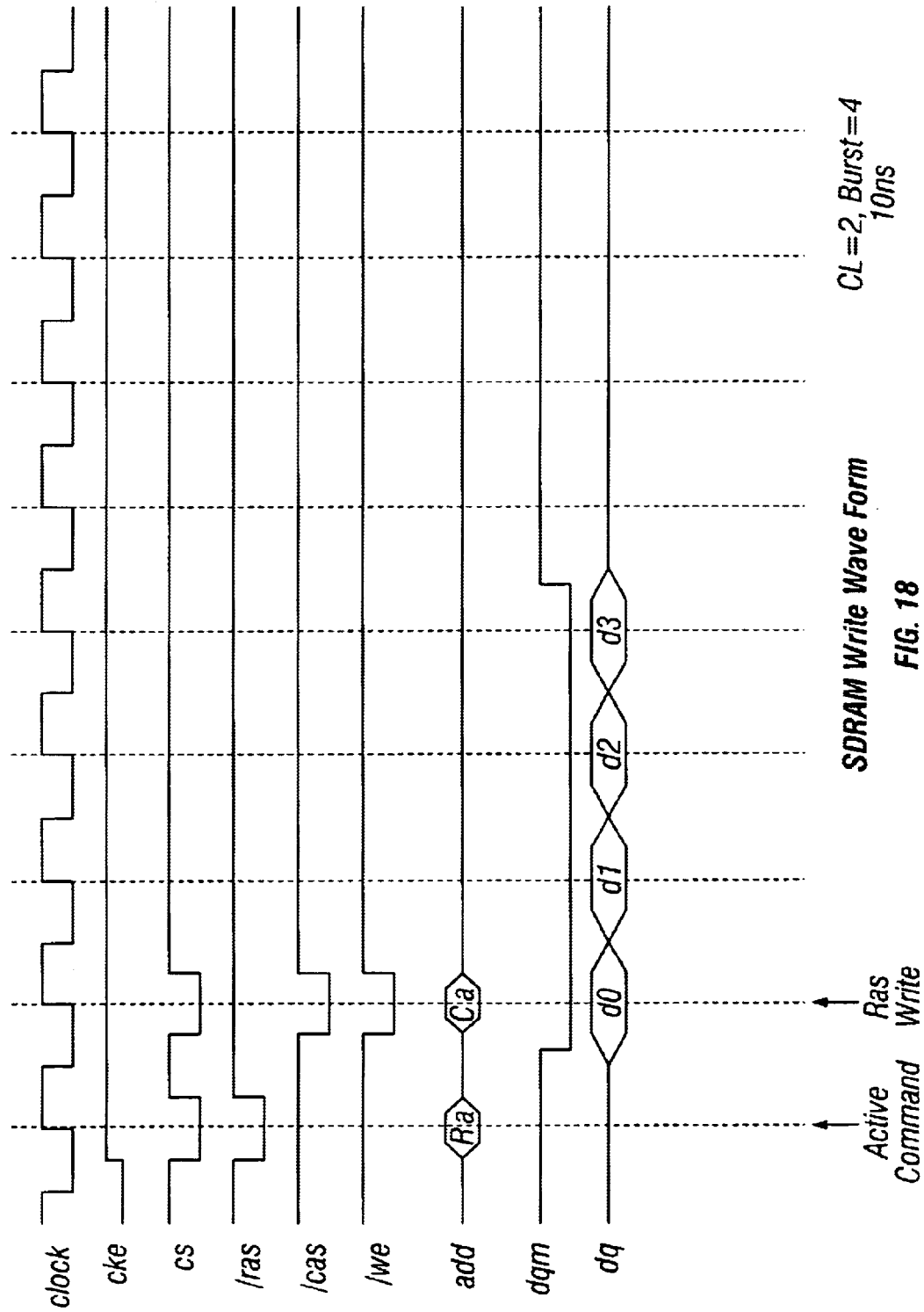
FIG. 18 is a timing diagram for a SDRAM write wave form.

The mode register and burst address decoder 1046 converts burst lengths from the SDRAM memory interface 926 into burst lengths that are recognized by the DDR memory array 822. Referring to FIG. 14, a circuit for the mode register and address decoder 1046 is shown. The decoder 1046 must convert the burst modes from the SDRAM memory interface 926 into standard DDR burst modes. The decoder 1046 has an encoder 1400 and a first set of multiplexers 1402a–1402c. The inputs to the multiplexers 1402a, 1402b, and 1402c are the different burst modes "010", "001", and "000" for the DDR memory array 822. The input to the encoder 1400 are address lines add[0], add[1] and add[2] which indicate the SDRAM burst mode. The appropriate multiplexer is enabled depending upon the burst mode indicated by the address lines add[0], add[1] and add[2]. The output of the multiplexers 1402a–1402c are the input to a second set of multiplexers 1404a–1404c which also have address lines add[0], add[1], and add[2] as inputs. The multiplexers 1404a–1404c are enabled by logically ANDING cke, cs_n, ras_n, cas_n and we_n with AND gate 1406. The respective output of each of the multiplexers 1404a–1404c generates mux_burst[0], mux_burst[1] and mux_burst[2]. The mode register and address decoder 1046 further includes address latch 1408 which latches address lines add[3] to add[11].

The address lines add[3] to add[11] from the address latch 1408 are placed on address bus 1410, along with the outputs from the multiplexers 1404a–1404c (i.e., mux_burst[0], mux_burst[1], and mux_burst[2]. The bus_addr[11:0] lines are inputted into shift register 1412 for use in burst mode, or multiplexer bus mux 1414. In order to enable the proper timing of bus mux 1414, control signals are fed into AND gates 1418 and 1420 with the result being logically OR'ed by OR gate 1422. The output of the multiplexer bus mux 1414 are address lines addr[11:0] which are fed into address latch 1416 and can be accessed as raddr[11:0] 1424 by the DDR memory array 822.

The FIFO buffer 1048 of the ASIC 818 performs bandwidth mismatch conversion to synchronize the SDRAM memory interface 926 and the DDR memory array 822. As previously mentioned, the SDRAM memory interface 926 operates at twice the bandwidth of the SDRAM memory array 822. The dual pipeline FIFO buffer 1048 can accommodate for the frequency mismatch by storing data from the SDRAM memory interface 926 that cannot be immediately written or read by the DDR memory array 822. Therefore the FIFO buffer 1048 can synchronize the read/write cycles.

Figure 13:
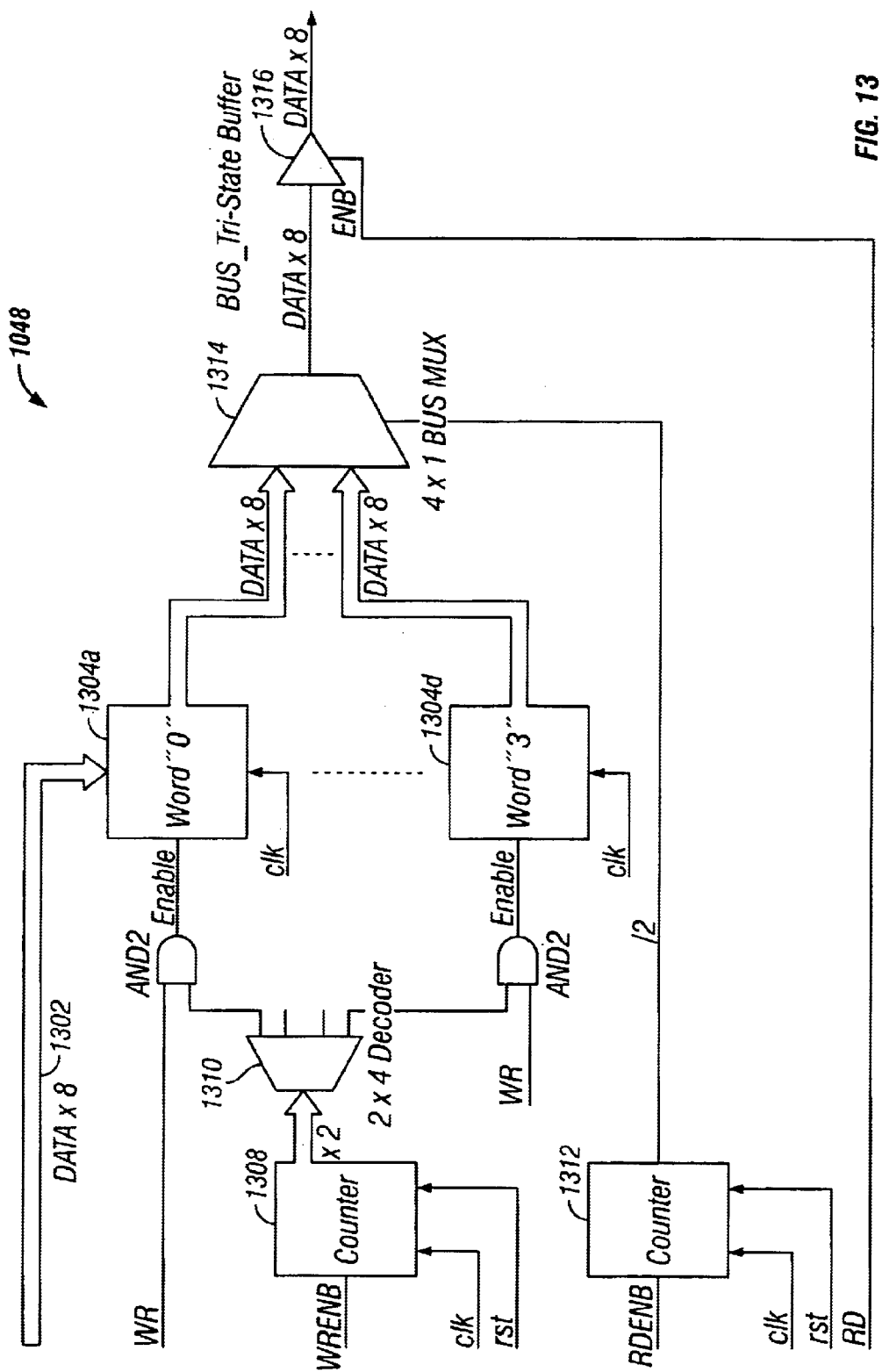
FIG. 13 is a circuit diagram of a synchronous dual pipeline synchronizing FIFO for the translator shown in FIG. 8.

Referring to FIG. 13, a circuit diagram for the FIFO buffer 1048 is shown. Data lines 1302 are inputted into buffers 1304a–1304d. For simplicity, buffers 1304b and 1304c are not shown. Buffer 1304a stores word "0", buffer 1304b stores word "1", buffer 1304c stores word "2" and buffer 1304d stores word "3". Each buffer 1304 is appropriately enabled from counter 1308 and 2×4 decoder 1310. The counter 1308 will provide a count which is decoded by the decoder 1310 to enable the appropriate buffer 1304. When the appropriate buffer 1304 is enabled, it's output is sent to 4×1 multiplexer 1314 which is enabled at the appropriate timing reference signal by counter 1312. Therefore, the 4×1 multiplexer 1314 can synchronize the data output for use by the DDR memory array 822.

Figure 11:
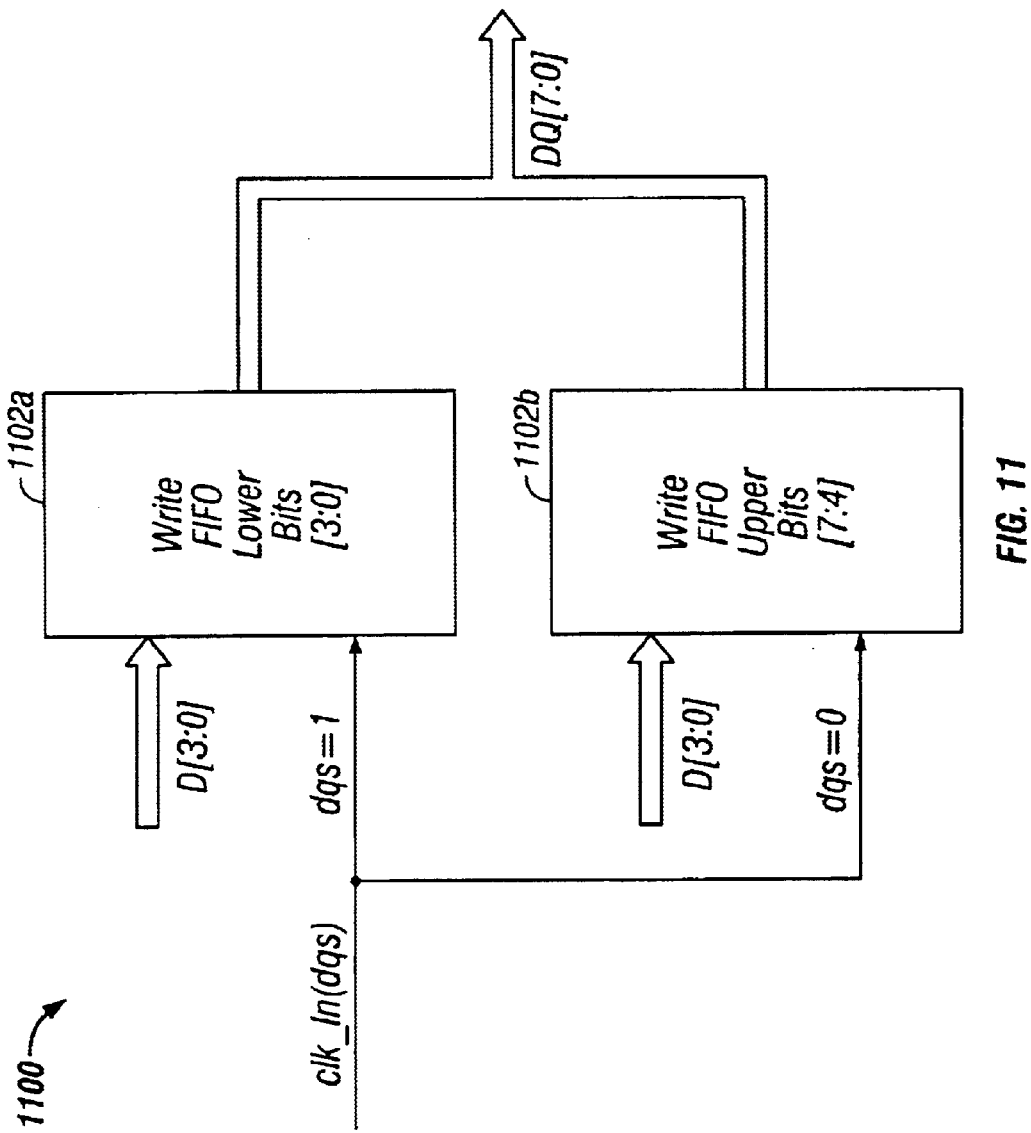
FIG. 11 is a circuit diagram of a DDR to SDRAM bit convertor for the translator shown in FIG. 8.

Referring to FIG. 11, a DDR to SDRAM Bit conversion circuit (nibble to byte) 1100 is shown. The data from the SDRAM memory interface 926 is eight bit data whereas the DDR memory array 822 uses four bit data. Therefore it is necessary to convert the data for proper operation. The conversion circuit 1100 has a lower bit buffer 1102a and an upper bit buffer 1102b. Data bus D[3:0] is inputted into each buffer. Each buffer is enabled by a clock in signal clk_in (dqs) which corresponds to the datastrobe dqs signal. The lower bit buffer 1102a is enabled when dqs=1 and will output lower bits DQ[3:0] at that time. Conversely, the upper bit buffer 1102b is enabled when dqs=0 and will output upper bits DQ[7:4] at that time. Therefore, it is possible to convert the four bit DDR memory data to eight bits for use by SDRAM memory interface 926.

Figure 12:
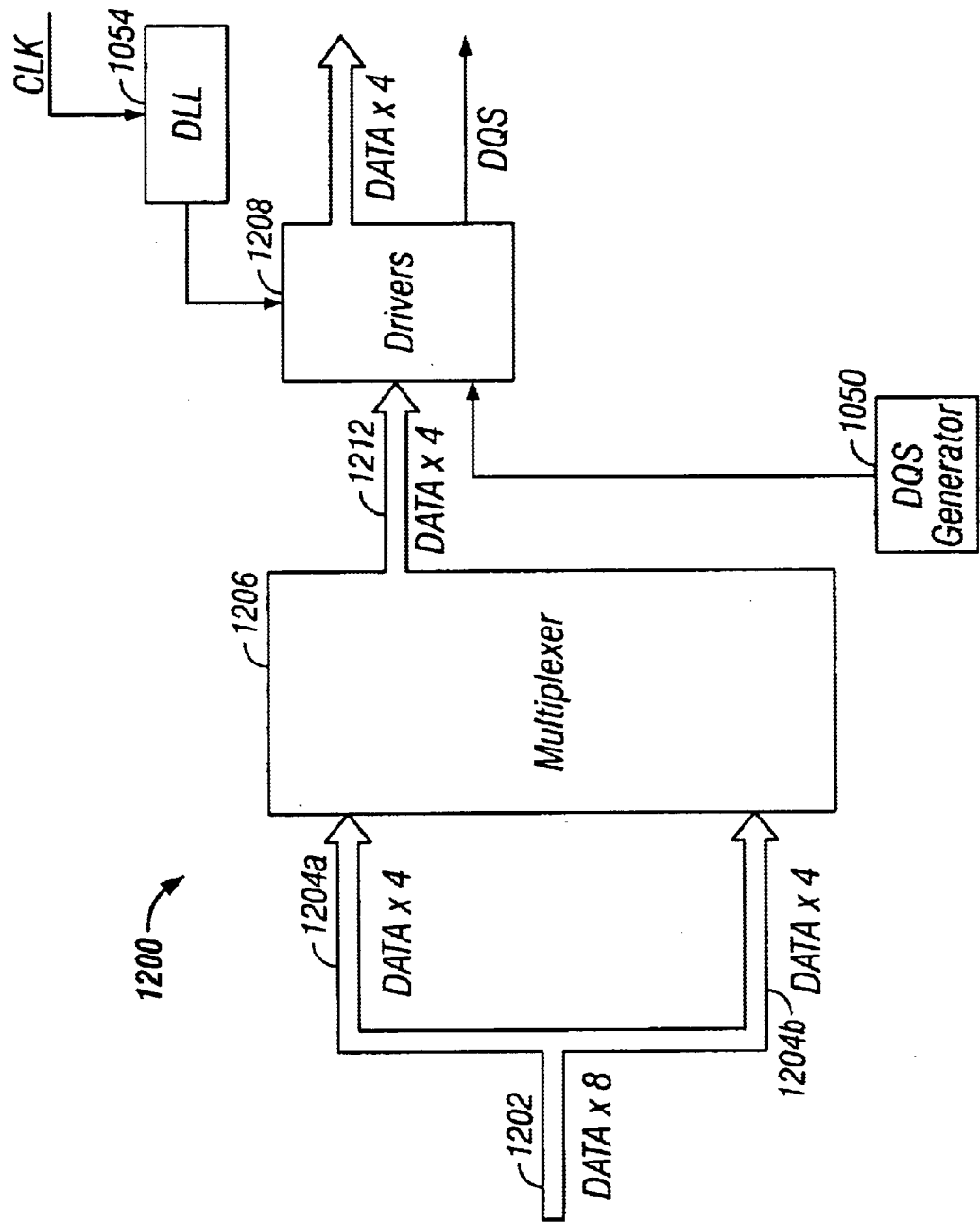
FIG. 12 is a circuit diagram of a SDRAM to DDR SDRAM bit convertor for the translator shown in FIG. 8.

Conversely, the eight bit SDRAM data must be converted to four bits for the DDR memory array 822. Referring to FIG. 12, a SDRAM to DDR bit conversion (Byte to Nibble) circuit 1200 is shown. Eight bit data 1202 from the SDRAM memory interface 926 is segregated into two sets for four bit data 1204a and 1204b which is inputted into multiplexer 1206. A select signal Sel enables the multiplexer 1206 to output the four bit data on data bus 1212. The outputted four bit data 1212 is inputted into driver module 1208 that is controlled by DQS Generator Finite State Machine 1050. Furthermore, a timing signal from DLL 1054 is provided to the drivers 1208. The drivers 1208 are operative to output four bit data, as well as data strobe signal DQS for use by DDR memory array 822. The DQS Generator Finite State Machine 1050 is controlled using the finite state diagrams shown and explained for FIGS. 19–21.

Additional modifications and improvements of the present invention may also be apparent to those of ordinary skill in the art. Thus the particular combination of parts described and illustrated herein is intended to represent only certain embodiments of the present invention, and is not intended to serve as limitations of alternative devices within the spirit and scope of the invention.

What is claimed is:

1. A circuit for converting signals between a memory interface and a memory array wherein the memory interface is not the same type as the memory array, the circuit comprising:

an interface converter for shifting the logic levels of the signals between the memory interface and the memory array; and a translation block for translating and synchronizing the signals between the memory interface and the memory array said translation block including a burst address decoder for translating burst addresses between the memory interface and the memory array, and a buffer for synchronizing and translating the signals between the memory interface and the memory array.

2. The circuit of claim 1 wherein the memory interface is a Synchronous Dynamic Random Access Memory (SDRAM) memory interface and the memory array is a Dual Data Rate (DDR) SDRAM memory array.

3. The circuit of claim 1 wherein the memory interface is a DDR memory interface and the memory array is a SDRAM memory array.

4. The circuit of claim 1 wherein the interface converter is configured to convert logic levels between LVTTL and SSTL-II logic levels.

5. A method for synchronizing and translating signals between a memory array and a memory interface wherein the memory array is not the same type as the memory interface, the method comprising the steps of:

a) shifting the logic level of the signals between the memory array and the memory interface;

b) translating the signals between the memory array and the memory interface with a burst decoder; and c) synchronizing the signals between the memory array and the memory interface.

6. The method of claim 5 wherein the memory array is a DDR memory array and the memory interface is a SDRAM memory interface.

7. The method of claim 5 wherein the memory array is a SDRAM memory array and the memory interface is a DDR memory interface.

8. The method of claim 5 wherein in step (a) the signals are shifted between LVTTL and SSTL-II logic levels.

9. A system for translating signals between a Dual Data Rate (DDR) memory array and a Synchronous Dynamic Random Access Memory (SDRAM) memory interface, the system comprising a SDRAM to DDR circuit in electrical communication between the SDRAM memory interface and the DDR memory array, the SDRAM to DDR circuit being configured to synchronize and translate signals between the SDRAM memory interface and the DDR memory array; and a DDR register in electrical communication between the SDRAM to DDR circuit and the DDR memory array, the DDR register being operative to provide registered memory input and output to the DDR memory array.

10. The system of claim 9 wherein the SDRAM to DDR circuit comprises:

an interface converter for shifting the logic levels of the signals; and a translation block for translating and synchronizing the signals between the SDRAM memory interface and the DDR memory array.

11. The system of claim 10 wherein the interface converter is configured to convert LVTTL logic levels to SSTL-II logic levels.

12. The system claim 10 wherein the translation block comprises:
   a burst address decoder for converting SDRAM burst lengths into DDR burst lengths; and
   a synchronizing buffer for performing bandwidth mismatch conversion between the SDRAM memory interface and the DDR memory array such that signals are synchronized between the SDRAM memory interface and the DDR memory array.

13. The system of claim 12 wherein the interface converter and the translation block are configured to convert signals between a SDRAM data bus of the SDRAM memory interface and a DDR data/DQS bus of the DDR memory array.

14. The system of claim 12 wherein the interface converter and the translation block are configured to convert SDRAM control/address signals to DDR control/address signals.

15. A system for translating signals between a Synchronous Dynamic Random Access Memory (SDRAM) array and a Dual Data Rate (DDR) memory interface, the system comprising a DDR to SDRAM circuit in electrical communication between the DDR memory interface and the SDRAM memory array, the DDR to SDRAM circuit being configured to synchronize and translate the signals between the SDRAM memory array and the DDR memory interface; and a SDRAM register in electrical communication between the DDR to SDRAM circuit and the SDRAM memory array, the SDRAM register being operative to provide registered memory input and output to the SDRAM memory array.

16. The system of claim 15 wherein the DDR to SDRAM circuit comprises:
   an interface converter for shifting the logic levels of the signals; and
   a translation block for translating the signals between the DDR memory interface and the SDRAM memory array.

17. The system of claim 16 wherein the interface converter is configured to convert SSTL-II logic levels to LVTTL logic levels.

18. The system of claim 16 wherein the translation block comprises:
   a burst address decoder for convening DDR burst lengths into SDRAM burst lengths; and
   a synchronizing buffer for performing bandwidth mismatch conversion between the DDR memory interface and the SDRAM memory array such that signals are synchronized between the DDR memory interface and the SDRAM memory array.

19. The system of claim 18 wherein the interface converter and the translation block are configured to convert signals between a DDR data/DQS bus of the DDR memory interface and a SDRAM data bus of the SDRAM memory array.

20. The system of claim 18 wherein the interface converter and the translation block are configured to convert DDR control/address signals to SDRAM control/address signals.

21. A method for synchronizing and translating signals between a memory array and a memory interface wherein the memory array is not the same type as the memory interface, the method comprising the steps of:
   a) shifting the logic level of the signals between the memory array and the memory interface;
   b) translating the signals between the memory array and the memory interface with a buffer; and
   c) synchronizing the signals between the memory array and the memory interface.

22. The method of claim 21 wherein the memory array is a DDR memory array and the memory interface is a SDRAM memory interface.

23. The method of claim 21 wherein the memory array is a SDRAM memory array and the memory interface is a DDR memory interface.

24. The method of claim 21 wherein in step (a) the signals are shifted between LVTTL and SSTL-II logic levels.

* * * * *

UNITED STATES PATENT AND TRADEMARK OFFICE
CERTIFICATE OF CORRECTION

PATENT NO.    : 6,707,756 B2
DATED         : March 16, 2004
INVENTOR(S)   : Hossein Amidi and Kelvin Marino It is certified that error appears in the above-identified patent and that said Letters Patent is hereby corrected as shown below:

<u>Title page,</u>
Item [12], replace "Amidi" with -- Amidi et al. --.
Item [75], Inventors, after "Hossein Amidi, Irvine, CA (US)" add -- Kelvin Marino, Lagunna Hills, CA (US) --.
Item [74], after "Thelen, Reid & Priest" add -- LLP --.

<u>Column 5,</u>
Lines 7, 9, 25 and 27, replace "$V_{DD}$" with -- $V_{DD}$ --.

Signed and Sealed this

Twenty-ninth Day of June, 2004

JON W. DUDAS
*Acting Director of the United States Patent and Trademark Office*